US 011756761B2

(12) United States Patent
Meng et al.

(10) Patent No.: US 11,756,761 B2
(45) Date of Patent: Sep. 12, 2023

(54) WIEN FILTER AND CHARGED PARTICLE BEAM IMAGING APPARATUS

(71) Applicant: Zhongke Jingyuan Electron Limited, Beijing (CN), Beijing (CN)

(72) Inventors: Qinglang Meng, Beijing (CN); Weiqiang Sun, Beijing (CN); Yan Zhao, Beijing (CN)

(73) Assignee: Zhongke Jingyuan Electron Limited, Beijing (CN), Beijing (CN)

( * ) Notice: Subject to any disclaimer, the term of this patent is extended or adjusted under 35 U.S.C. 154(b) by 0 days.

(21) Appl. No.: 17/586,706

(22) Filed: Jan. 27, 2022

(65) Prior Publication Data

US 2022/0157556 A1     May 19, 2022

Related U.S. Application Data

(63) Continuation of application No. 17/006,149, filed on Aug. 28, 2020, now Pat. No. 11,239,044.

(30) Foreign Application Priority Data

Aug. 28, 2019    (CN) .......................... 201910803331.1

(51) Int. Cl.
    *H01J 37/147*      (2006.01)
    *H01J 37/10*       (2006.01)
    (Continued)

(52) U.S. Cl.
    CPC .......... *H01J 37/1475* (2013.01); *H01J 37/10* (2013.01); *H01J 37/1477* (2013.01);
    (Continued)

(58) Field of Classification Search
    CPC .. H01J 37/00; H01J 37/02; H01J 37/26; H01J 37/28; H01J 37/1475; H01J 37/10;
    (Continued)

(56) References Cited

U.S. PATENT DOCUMENTS

| 5,770,862 A | 6/1998 | Ooaeh et al. |
| 6,055,719 A | 5/2000 | Ooaeh et al. |

(Continued)

FOREIGN PATENT DOCUMENTS

| CN | 108231511 | 6/2018 |
| TW | 468195 | 12/2001 |
| WO | 2013/062158 | 5/2013 |

OTHER PUBLICATIONS

Chinese Office Action, issued in the corresponding Chinese patent application No. 201910803331.1, dated Jul. 22, 2021, 10 pages.

*Primary Examiner* — Jason L McCormack
(74) *Attorney, Agent, or Firm* — Hamre, Schumann, Mueller & Larson, P.C.

(57) ABSTRACT

A Wien filter and a charged particle beam imaging apparatus are provided. The Wien filter Wien filter, including a Wien filter body which includes: an electrostatic deflector, including at least one pair of electrodes, respective two electrodes in each pair of which are opposite to each other, each electrode including an electrode body constructed in an arc-shaped form, and respective electrode bodies of respective two electrodes in each pair of the at least one pair of electrodes being arranged concentrically with and opposite to each other in a diameter direction, and the at least one pair of electrodes being configured to generate respective electric fields by cooperation of the respective two electrodes in each pair of the at least one pair of electrodes, in the condition of respective bias voltages applied individually thereon; and a magnetic deflector, including at least one pair of magnetic poles, respective two magnetic poles in each pair of which are opposite to each other, each magnetic pole including a magnetic pole body constructed in an arc-shaped form, and respective magnetic pole bodies of respective two magnetic poles in each pair of the at least one pair of magnetic poles being arranged concentrically with and opposite to each (Continued)

other in the diameter direction, and the magnetic pole bodies of the at least one pair of magnetic poles in the magnetic deflector and the electrode bodies of the at least one pair of electrodes in the electrostatic deflector being arranged concentrically and spaced apart from each other in a circumferential direction, and the at least one pair of magnetic poles being configured to generate respective magnetic fields by cooperation of respective two magnetic poles in each pair of the at least one pair of magnetic poles; a resultant electric field formed collectively by all of the respective electric fields is perpendicular to a resultant magnetic field formed collectively by all of the respective magnetic fields; and each electrode is also provided with a respective first protrusion extending radially inwards from a radial inner side of the respective electrode body thereof, and each magnetic pole is also provided with a second protrusion extending radially inwards from a radial inner side of the respective magnetic pole body thereof.

18 Claims, 14 Drawing Sheets

(51) Int. Cl.
  *H01J 37/244* (2006.01)
  *H01J 37/28* (2006.01)
(52) U.S. Cl.
  CPC ............ *H01J 37/244* (2013.01); *H01J 37/28* (2013.01); *H01J 2237/057* (2013.01); *H01J 2237/1516* (2013.01); *H01J 2237/1534* (2013.01)

(58) Field of Classification Search
  CPC .. H01J 37/1477; H01J 37/244; H01J 37/1471; H01J 37/05; H01J 37/261; H01J 37/1472; H01J 2237/057; H01J 2237/1516; H01J 2237/1534; H01J 2237/1508; H01J 49/288
  USPC .............................. 250/396 R, 306, 307, 311
  See application file for complete search history.

(56) References Cited

U.S. PATENT DOCUMENTS

| | | |
|---|---|---|
| 7,164,139 B1 | 1/2007 | Toth et al. |
| 8,421,029 B1 | 4/2013 | Ren et al. |
| 8,436,317 B1* | 5/2013 | Chen ..................... H01J 49/288 |
| | | 250/396 ML |
| 10,777,382 B2 | 9/2020 | Li et al. |
| 11,075,056 B2 | 7/2021 | Li et al. |
| 2005/0017202 A1 | 1/2005 | White |
| 2008/0185514 A1* | 8/2008 | Frosien ................... H01J 37/08 |
| | | 250/288 |
| 2014/0061461 A1* | 3/2014 | Hayashi ................ H01J 37/263 |
| | | 250/307 |
| 2017/0271124 A1* | 9/2017 | Sasaki ................ H01J 37/1474 |
| 2018/0005797 A1* | 1/2018 | Kato ..................... H01J 37/244 |
| 2020/0234914 A1 | 7/2020 | Li et al. |
| 2021/0110994 A1 | 4/2021 | Li et al. |

* cited by examiner

WIEN FILTER AND CHARGED PARTICLE BEAM IMAGING APPARATUS

CROSS-REFERENCE TO RELATED APPLICATION

This application is a continuation application of U.S. application Ser. No. 17/006,149 filed on Aug. 28, 2020, entitled "WIEN FILTER AND CHARGED PARTICLE BEAM IMAGING APPARATUS", which in turn claims the benefit of Chinese Patent Application Invention No. 201910803331.1 filed on Aug. 28, 2019 in the State Intellectual Property Office of China, the whole disclosure of which is incorporated herein by reference.

BACKGROUND

Field

Embodiments of the present disclosure generally relate to the technical field of semiconductor detection technology; and more particularly to a device for example in the form of a Wien electromagnetic filter, which is for example in the form of a composite deflector configured to generate an electric field and a magnetic field orthogonal to each other simultaneously for realizing a deflection of a charged particle beam having a certain mass, a certain direction of movement, certain charges and the like; and in particular to a Wien filter for secondary charged particles and a charged particle beam imaging apparatus.

Description of the Related Art

In recent years, charged particle beam inspection and imaging apparatus are widely used in semiconductor industry, e.g., scanning electron microscope which is typically used for defect detection on chip and other production objects. A main principle of the imaging and detection apparatuses with the charged particle beam is to use the charged particle beam (such as high-energy electron beam, and the like) to bombard a bombardment region on a surface of an object to be detected or tested (e.g., a chip to be tested), detect the secondary charged particle beam generated in the bombarded area, such as secondary electrons, back-scattered electrons, and the like, so as to obtain a variety of physical and chemical information of a sample itself which is to be tested, such as topography, composition, feature distribution and the like. Typical applications of the charged particle beam detection and imaging apparatus are usually, for example, detection on microscopic patterns located on mask or reticle and semiconductor wafer, and measurement of microscopic patterns located on mask or reticle and semiconductor wafer, as well as detection on open-circuit defects (such as disconnection of CMOS and contact holes) and short-circuit defects in CMOS integrated circuit, are carried out, based on electron beam within vacuum.

In the charged particle beam detection and imaging apparatus, a Wien filter which uses composite (typically orthogonal) electric field and magnetic field to deflect the secondary charged particles is one type of key components, and has a primary function of scanning the secondary charged particles. Specifically, the Wien filter for example typically comprises an electric deflector and a magnetic deflector arranged in a cross arrangement relative to each other (i.e., crossing each other; more typically, for example, orthogonal to each other, i.e., in a crisscross arrangement), thereby generating an electric field and magnetic field orthogonal to each other, which cooperate with each other to deflect the charged particles depending on respective masses, moving directions, charges and the like of the secondary charged particles in the secondary charged particle beam incident onto and entering the deflection field generated by the deflector.

In a relevant technical field, it is required urgently to obtain an improved Wien filter which may achieve a compromise between a simplification in structural design and a uniformity of field distribution of a deflection field as obtained.

SUMMARY

The embodiments of the present disclosure have been made to overcome or alleviate at least one aspect of the above mentioned disadvantages and/or shortcomings in the prior art, by providing a Wien filter for secondary charged particles and a charged particle beam imaging apparatus.

To achieve the above purpose, following technical solutions are adopted in exemplary embodiments of the invention.

According to one aspect of embodiments of the disclosure, there is provided a Wien filter, comprising a Wien filter body which comprises: an electrostatic deflector, comprising at least one pair of electrodes, respective two electrodes in each pair of which are opposite to each other, each electrode comprising an electrode body constructed in an arc-shaped form, and respective electrode bodies of respective two electrodes in each pair of the at least one pair of electrodes being arranged concentrically with and opposite to each other in a diameter direction, and the at least one pair of electrodes being configured to generate respective electric fields by cooperation of the respective two electrodes in each pair of the at least one pair of electrodes, in the condition of respective bias voltages applied individually thereon; and a magnetic deflector, comprising at least one pair of magnetic poles, respective two magnetic poles in each pair of which are opposite to each other, each magnetic pole comprising a magnetic pole body constructed in an arc-shaped form, and respective magnetic pole bodies of respective two magnetic poles in each pair of the at least one pair of magnetic poles being arranged concentrically with and opposite to each other in the diameter direction, and the magnetic pole bodies of the at least one pair of magnetic poles in the magnetic deflector and the electrode bodies of the at least one pair of electrodes in the electrostatic deflector being arranged concentrically and spaced apart from each other in a circumferential direction, and the at least one pair of magnetic poles being configured to generate respective magnetic fields by cooperation of respective two magnetic poles in each pair of the at least one pair of magnetic poles; a resultant electric field formed collectively by all of the respective electric fields is perpendicular to a resultant magnetic field formed collectively by all of the respective magnetic fields; and each electrode is also provided with a respective first protrusion extending radially inwards from a radial inner side of the respective electrode body thereof, and each magnetic pole is also provided with a second protrusion extending radially inwards from a radial inner side of the respective magnetic pole body thereof.

According to an exemplary embodiment of the present disclosure, the at least one pair of magnetic poles is formed by a magnetically permeable material and further comprise respective excitation coils which are attached onto respective radial outer sides of the respective magnetic pole bodies of the at least one pair of magnetic poles, respectively, and are configured to generate respective magnetic fields by cooperation of respective two magnetic poles in each pair in case that an excitation current flows through the excitation coils; or the at least one pair of magnetic poles is formed by a permanent magnetic material, and are configured to generate respective magnetic fields by cooperation of respective two magnetic poles in each pair.

According to an exemplary embodiment of the present disclosure, the at least one pair of magnetic poles is formed by an electrically conductive material into additional electrodes, and is configured to generate respective additional electric fields by cooperation of electric conduction of respective two magnetic poles in each pair in case that bias voltages are applied thereon respectively; and/or wherein the at least one pair of electrodes is formed by a magnetically permeable material into additional magnetic poles and further comprises respective additional excitation coils which are attached onto respective radial outer sides of the respective electrode bodies of the at least one pair of electrodes, and is configured to generate respective additional magnetic fields by cooperation of respective two electrodes in each pair in case that an excitation current flows through the excitation coils.

According to an exemplary embodiment of the present disclosure, the respective two electrode bodies of each pair of electrodes extend across an equivalent radian and have a same shape as each other, respectively, in a circumferential direction of the respective two electrode bodies; and/or the respective two magnetic pole bodies of each pair of magnetic poles extend across an equivalent radian and have a same shape as each other, respectively, in a circumferential direction of the respective two magnetic pole bodies.

According to an exemplary embodiment of the present disclosure, the respective electrode bodies of the at least one pair of electrodes and the respective magnetic pole bodies of the at least one pair of magnetic poles extend across an equivalent radian and have a same shape, respectively, in a same circumference defined collectively by the respective electrode bodies and the respective magnetic pole bodies, and have a same inner radius at respective radial inner sides and a same outer radius at respective radial outer sides; and the respective electrode bodies of the at least one pair of electrodes and the respective magnetic pole bodies of the at least one pair of magnetic poles are spaced apart from one another angularly in the same circumference defined collectively by the respective electrode bodies and the respective magnetic pole bodies, and are arranged to be in rotational symmetry with reference to one another, and respective two electrodes in each pair of electrodes have central symmetry with reference to each other, and respective two magnetic poles in each pair of magnetic poles have central symmetry with reference to each other.

According to an exemplary embodiment of the present disclosure, the at least one pair of electrodes and the at least one pair of magnetic poles are arranged to space apart from one another at a same angle circumferentially.

According to an exemplary embodiment of the present disclosure, the at least one pair of electrodes is merely one pair of electrodes, and the at least one pair of magnetic poles is merely one pair of magnetic poles, and the pair of electrodes and the pair of magnetic poles are alternately spaced apart from one another at an angle of 90°.

According to an exemplary embodiment of the present disclosure, the first protrusions and the second protrusions are shaped and dimensioned to minimize an off-axis aberration of a charged particle beam being incident on and entering the Wien filter and passing therethrough.

According to an exemplary embodiment of the present disclosure, each of respective first protrusions of the at least one pair of electrodes extends circumferentially across an angle not exceeding a first angle range, and projects from respective radial inner side of respective electrode body at a distance not exceeding a first radial distance; and each of respective second protrusions of the at least one pair of magnetic poles extends circumferentially across an angle not exceeding a second angle range, and projects from respective radial inner side of respective magnetic pole body at a distance not exceeding a second radial distance.

According to an exemplary embodiment of the present disclosure, the first angle range is from 5° to 40° and the first radial distance is between 0.1 and 0.9 times of the respective inner radius at respective radial inner side of the respective electrode body of each electrode; and the second angle range is from 5° to 40° and the second radial distance is between 0.1 and 0.9 times of the respective inner radius at respective radial inner side of the respective magnetic body of each magnetic pole.

According to an exemplary embodiment of the present disclosure, each of respective first protrusions of the at least one pair of electrodes is shaped to be in the form of a boss, which projects from the respective radial inner side of the respective electrode body of the respective electrode and is provided with an arch-shaped concave top portion; and/or each of respective second protrusions of the at least one pair of magnetic poles is shaped to be in the form of a boss, which projects from the respective radial inner side of the respective magnetic pole body of the respective magnetic pole and is provided with an arch-shaped concave top portion.

According to an exemplary embodiment of the present disclosure, wherein each of respective first protrusions of the at least one pair of electrodes is shaped to be in the form of one of a partial sphere, a partial cone and a partial pyramid projecting from the respective radial inner side of the respective electrode body of the respective electrode and is provided with a convex top portion; and/or each of respective second protrusions of the at least one pair of magnetic poles is shaped to be in the form of one of a partial sphere, a partial cone and a partial pyramid projecting from the respective radial inner side of the respective magnetic pole body of the respective magnetic pole and is provided with a convex top portion.

According to an exemplary embodiment of the present disclosure, each of respective first protrusions of the at least one pair of electrodes is shaped to be in the form of one of a truncated frustum of a cone, a truncated spherical segment, a frustum, and a multi-stage stepped boss projecting from the respective radial inner side of the respective electrode body of the respective electrode and is provided with a flat top portion; and/or each of respective second protrusions of the at least one pair of magnetic poles is shaped to be in the form of one of a truncated frustum of a cone, a truncated spherical segment, a frustum, and a multi-stage stepped boss projecting from the respective radial inner side of the respective magnetic pole body of the respective magnetic pole and is provided with a flat top portion.

According to an exemplary embodiment of the present disclosure, the first protrusions and the second protrusions are both constructed in one and the same shape.

According to an exemplary embodiment of the present disclosure, the first angle range and the second angle range are respectively equal to respective radian angle ranges occupied by each of first imaginary protrusions used instead of all the first protrusions of the at least one pair of electrodes and each of second imaginary protrusions used instead of all the second protrusions of the at least one pair of magnetic poles, respectively such that: electrodes alternatively having the first imaginary protrusions each of which is in the form of a boss projecting from respective radial inner side of the respective electrode body and is provided with an arch-shaped concave top portion, and magnetic poles alternatively having the second imaginary protrusions each of which is in the form of a boss projecting from respective radial inner side of the respective magnetic pole body and is provided with an arch-shaped concave top portion, cooperate with each other to generate an imaginary deflection field equivalent to the deflection field as generated by the Wien filter.

According to an exemplary embodiment of the present disclosure, the Wien filter further comprise a regulator, the regulator comprising a pair of regulator bodies which are annular and are arranged coaxially on both sides of the Wien filter body; in response to the fact that the at least one pair of electrodes is formed by a magnetically permeable material into additional magnetic poles and further comprises respective additional excitation coils which are attached onto respective radial outer sides of the respective electrode bodies of the at least one pair of electrodes, the pair of regulator bodies are two magnetic rings arranged coaxially on both sides of the Wien filter body and spaced apart from the Wien filter body respectively, and the magnetic rings are located and dimensioned to converge magnetic field lines at an edge of the resultant magnetic field which distributes substantially along the optical axis and would have been originally generated by the Wien filter without the regulator, so as to match the resultant electric field, along the optical axis; and in response to the fact that the at least one pair of magnetic poles is formed by an electrically conductive material into additional electrodes, the pair of regulator bodies are two electrode rings arranged coaxially on both sides of the Wien filter body and spaced apart from the Wien filter body respectively, and the electrode rings are located and dimensioned to correct a distribution of the electric field which distributes substantially along the optical axis and would have been originally generated by the Wien filter without the regulator, at an edge of the electric field where an electric field intensity has its value being close to 0, so as to match the resultant magnetic field, along the optical axis.

According to an exemplary embodiment of the present disclosure, an outer radius of the boss of the each magnetic pole is R2, and an inner radius of each magnetic ring ranges between 01*R2 and 1.5*R2, with a spacing of the magnetic rings from the Wien filter body being between 0.1*R2 and 3*R2.

According to an exemplary embodiment of the present disclosure, an outer radius of the boss of the each electrode ring is R2, and an inner radius of each electrode ring ranges between 01*R2 and 1.5*R2, with a spacing of the electrode rings from the Wien filter body being between 0.1*R2 and 3*R2.

According to an exemplary embodiment of the present disclosure, the electrostatic deflector comprises merely one pair of electrodes, respective two electrodes of which are opposite to each other; and the magnetic deflector comprises only one pair of magnetic poles, respective two magnetic poles of which are opposite to each other.

According to a second aspect of embodiments of the disclosure, there is provided a charged particle beam imaging apparatus, which is configured to project a charged particle beam to a surface of a sample to be tested and in turn to image the charged particle beam, the charged particle beam imaging apparatus further comprising: a charged particle source configured to emit the charged particle beam; at least one pair of deflectors, which are symmetrically arranged with respect to an optical axis of the charged particle beam, and are configured to deflect and project the charged particle beam to the surface of the sample to be tested in response to a scanning signal applied thereon; an objective lens, which is arranged coaxially with the optical axis and downstream the at least one pair of deflectors, and is configured to converge and finally project the charged particle beam onto the surface of the sample to be tested; a secondary charged particle detector, which is located along the optical axis but offset from the optical axis and between the charged particle source and the sample to be tested, and is configured to collect and image the secondary charged particles generated by the charged particle beam projected to the sample to be tested; and the Wien filter as above, which is located in the objective lens and between the sample and the secondary charged particle detector, and is configured to receive the secondary charged particles emitted from the sample and deflect the secondary charged particles toward the secondary charged particle detector.

BRIEF DESCRIPTION OF THE DRAWINGS

In order to more clearly illustrate technical solutions of the embodiments of the present disclosure, the drawings required to be used with the description of the embodiments of the present disclosure will be briefly described by way of example as below in which corresponding reference numerals denote corresponding components. It is apparent that the drawings in the following description are merely some embodiments of the present disclosure. For those skilled in the art, other drawings can be obtained according to these drawings without paying any creative efforts. The accompanying drawings are used to provide a further understanding of the technical solution of embodiments of the disclosure, and constitute a part of the specification, for cooperating with embodiments of the disclosure to explain the technical solution of the embodiments of the disclosure, rather than forming any restriction on the technical solution of the embodiments of the disclosure, wherein.

DETAILED DESCRIPTION

Figure 1:
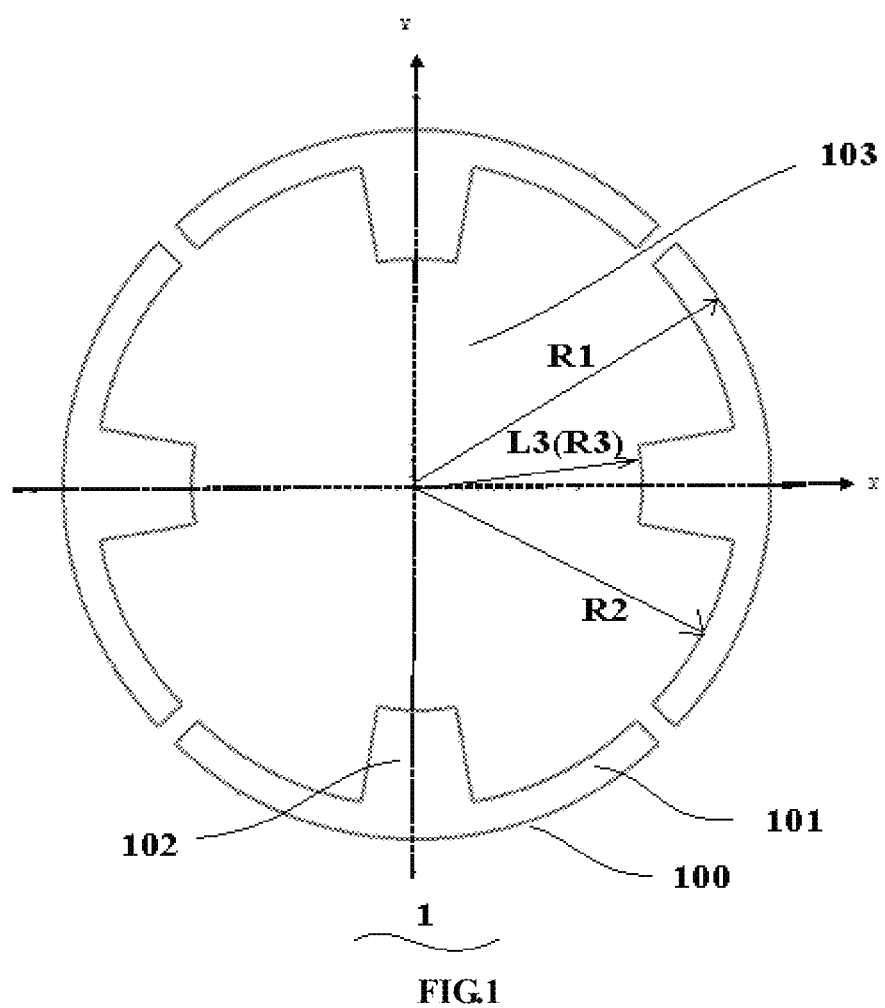
FIG. 1 illustrates a schematic structural view of a multi-pole deflector for a charged particle beam according to embodiments of the present disclosure, schematically showing that respective schematic structures of various poles are provided with respective protrusions protruding/projecting inwards from respective radial inner sides thereof, and respective schematic arrangements of various poles in which each protrusion is in the form of a boss which projects from the respective radial inner side of the respective pole and is provided with an arched concave top portion.

The technical solution of embodiments of the present disclosure will be further interpreted in detail with reference to the accompanying drawings. In the specification, same or similar reference numerals denote same or similar components. The following description of embodiments of the present disclosure with reference to the accompanying drawings is merely intended to interpret the general inventive concept of embodiments of the present disclosure, rather than being construed as a limitation of the present disclosure.

The accompanying drawings are used to illustrate the contents of embodiments of the present disclosure. Dimensions and shapes of the components in the drawings do not demonstrate true scales of components of a Wien filter for secondary charged particles and a charged particle beam imaging apparatus.

In relevant technologies, for example, in the charged particle beam imaging apparatus, by way of example, there is a Wien filter for deflecting a secondary charged particle beam, which is a composite deflector constructed to comprise, for example, electrostatic deflector(s) and magnetic deflector(s) (e.g., both types being arranged orthogonal to each other). As the basis of the Wien filter, above all, an improvement in the compromise/trade-off between the simplification of structure design (e.g., a minimal number of each type of electrodes and magnetic poles, and a minimal number of feed ports required by electrodes and magnetic poles respectively) and uniformity of the resultant deflection field the uniformity of the distribution of the resultant deflection field (especially in a paraxial region next to an optical axis z), are discussed hereinafter.

A deflection of a charged particle beam or a secondary charged particle beam is implemented by a bipolar type (i.e., a dual-pole type) deflection field which is generated by a deflector, e.g., a dual-pole type magnetic field or a dual-pole type electric field (i.e., a magnetic field formed by both N pole and S pole disposed opposite to each other; or an electric field formed by two electrodes of opposite electric polarities (i.e., a positive electrode and a negative electrode)). Accordingly, for example, the multi-pole deflector may be the magnetic deflector which is formed by magnetic poles which are provided with respective coils respectively to create opposite magnetic polarities thereon respectively so as to function as two types of poles disposed opposite to each other; or the multi-pole deflector may be the electric deflector which is formed by electrodes which have two opposite electric polarities respectively so as to function as two types of poles disposed opposite to each other.

One deflector having a dual-pole deflection field arrangement and functioning as a basic unit (thus it can be referred to as a dual-pole field deflector unit, hereinafter), may have following main characteristics: as far as specific structure and feeding of electrodes and magnetic poles are concerned respectively, there exist a symmetric plane and an antisymmetric plane, comprising an optical axis Z orthogonal to the deflection field, respectively; and the electric field or the magnetic field generated thereby is perpendicular to the optical axis Z. In order to achieve deflected scanning at any angle on a two-dimensional surface, for example, at least two dual-pole field deflector units may be arranged to be in a 2 N-pole structure, wherein N is the number of the dual-pole field deflector units (i.e., the number of the dual-pole field deflectors functioning as the basic units), and accordingly the multi-pole deflector having the 2 N-pole structure comprising 2N poles. In a more specific example, two dual-pole field deflectors functioning as basic units are arranged collectively into a quadrupole structure. The multi-pole deflector having the 2 N-pole structure for example generates N secondary deflection fields (also referred to as "deflection sub-fields") in a coplanar distribution, and then a resultant deflection field which is obtained by a synthesis of these secondary deflection fields by combination of vectors is essentially an equivalent dual-pole field, too, by way of example.

For a multi-pole deflector having at least two (e.g., a plurality of pairs of) dual-pole field deflectors, first of all, respective two opposite poles in each dual-pole field deflector are usually two poles in the form of two opposed plates parallel with each other, resulting in that a condition of edge distribution of a respective secondary deflection field generated thereby at the poles (especially at ends of the poles) significantly differs from a condition of central distribution of the respective secondary deflection field (e.g., field lines of the respective secondary deflection field are relatively uniformly distributed and are almost parallel with one another, centrally within the secondary deflection field), due to a distortion of field lines of the respective secondary deflection field at the poles (especially at ends of the poles) caused by an abrupt change in contour of the poles there, which fact is not conducive to realization of uniformity of an overall distribution of the respective secondary deflection field and a smooth transition of the condition of field distribution from inside of the secondary deflection field to a boundary region of the secondary deflection field. Furthermore, in the multi-pole deflector having at least two dual-pole field deflectors, in a condition of a relatively small number of the dual-pole field deflectors, although the multi-pole deflector has a relatively simple structure due to the relatively small number of poles and the relatively small number of feed ports required by the poles, the uniformity of the resultant deflection field in a paraxial region of the multi-pole magnetic deflector next to the optical axis Z is relatively poor, resulting in a relatively higher deflection aberration and an impact on quality of an off-axis beam spot; alternatively, in a condition of a relatively large number of the dual-pole field deflectors, due to the relatively large number of poles and the relatively large number of feed ports required by the poles, not only difficulties in the processing and assembly accuracy of the structure may be incurred, but also a need for an additional power supply will be created.

Therefore, in order to ensure that both the uniformity of the distribution of the field lines of the resultant deflection field in the distribution region of the deflection field which is defined by the poles of the multi-pole deflector (especially in the paraxial region of the multi-pole magnetic deflector next to the optical axis Z passing through the distribution region of the deflection field) for the passage of charged particles to be deflected therethrough, and the smoothness of field lines of the secondary deflection fields of the deflection field from the center to the edge of the deflection field may be achieved, with a structure of the multi-pole deflector simplified as much as possible (e.g., the minimum number of poles and the minimum number of feed ports), then, an improved multi-pole deflector is further proposed in the embodiment of the disclosure.

FIG. 1 illustrates a schematic structural view of a multi-pole deflector for a charged particle beam according to embodiments of the present disclosure, schematically showing that respective schematic structures of various poles are provided with respective protrusions protruding/projecting inwards from respective radial inner sides thereof, and respective schematic arrangements of various poles in which each protrusion is in the form of a boss which projects from the respective radial inner side of the respective pole and is provided with an arc-shaped concave top portion.

As illustrated in FIG. 1, a multi-pole deflector 1 for a charged particle beam is provided, which comprising at least two pairs of poles 100, each pole 100 in each pair of poles comprising: a main body 101 constructed in the form of a circular arc-shaped section; and a protrusion 102 projecting from an radial inner side of the main body 101. Respective two main bodies 101 of each pair of poles 100 are arranged concentrically with each other and diametrically opposite to each other, and the at least two pairs of poles 100 at least partially encompass and delimit a through-hole 103 thereamong (i.e., an axial through-hole 103), which opens axially and is configured to receive the charged particle beam to be deflected by the deflector 1 and to pass therethrough deflected charged particle beam; and poles in pairs of the at least two pairs of poles 100 of the deflector 1 cooperate to generate respective secondary deflection fields distributed within the through-hole and across an internal space defined within the through-hole, respectively, and the secondary deflection fields are synthesized by combination of vectors into a resultant deflection field of the deflector which is distributed within and across the through-hole 103 and is configured to deflect the charged particle beam passing therethrough.

As far as the multi-pole deflector 1 as above is concerned, an operation principle on which the embodiments of the present disclosure are based is above all described, hereinafter.

As described above, on the one hand, respective two main bodies 101 of each pair of poles in the at least two pairs of poles 100, are each in the form of a circular arc-shaped section and are arranged concentrically with respect to the optical axis Z, and are arranged diametrically opposite; in other words, respective two main bodies 101 in each pole 100 are arranged concentrically in the circumferential direction, and are arranged to face towards each other in the diametrical direction. Such an arrangement in which respective two main bodies 101 of two poles in pair are disposed diametrically opposite to each other, in essence, facilitates that edge field lines of a respective secondary deflection field formed by respective two main bodies 101 in each pair of poles at ends of the two poles in pair extend substantially along the circumferential direction or in a direction close to the circumferential direction, such that the distribution of the edge field lines of these secondary deflection fields generated by pairs of poles in the deflector will in essence minimally influence the charged particle beam or secondary charged particle beam passing through the through-hole 103 which is at least partially encompassed and delimited by the poles 100 of the multi-pole deflector 1 and opens axially. As such, the influence of the distortion of the field lines of the respective secondary deflection fields of individual dual-pole deflectors in the multi-pole deflector 1 at edges as compared with the field lines at center thereof, on the charged particle beam or secondary charged particle beam passing through the axial through-hole 103 of the multi-pole deflector is minimized, with aforementioned arrangement in which respective two main bodies 101 of two poles 100 in pair are disposed opposite to each other in the circumferential direction.

On the other hand, as described above, each pole 100 is also provided with a respective protrusion 102 projecting radially inwards from the radial inner side of its main body 101. By providing the protrusion 102 projecting radially inward from the respective main body 101 of each pole, a difference between a spacing between respective central portions of respective two poles 100 in each pair of poles (such a spacing would have been relatively larger without the protrusion) and another spacing between respective end portions of respective two poles 100 in each pair of poles (such another spacing is relatively smaller, as compared with the distance between respective central portions without the protrusion) may be decreased substantially to an extent. In other words, a gradient of the spacing between respective two poles in each pair of poles in each dual-pole field deflector which changes from the central portions of the respective two poles towards the end portions thereof, will be decreased. As such, in the condition that the influence of the distortion of the field lines at the edges of the poles 100 on the charged particle beam or secondary charged particle beam is improved as described above, a trend that the spacing between respective two poles in each pair of poles 100 at the central portions is significantly different from that at the end portions is also alleviated, such that the significant change of the spacing between the respective two poles in each pair of poles 100 which is caused by the arrangement of the poles in the circumferential direction is compensated for, facilitating improving the uniformity of the resultant deflection field generated by the multi-pole deflector in a paraxial region next to the optical axis Z.

Therefore, it can be seen that, the uniformity of the resultant deflection field generated by the multi-pole deflector within the through-hole 103 which is at least partially encompassed and delimited by the various poles 100 of the multi-pole deflector 1 (especially in the paraxial region next to the optical axis Z) is improved, by a cooperation between two aspects of settings, i.e., the arrangement in which respective two main bodies 101 of two poles 100 in each pair are disposed opposite to each other in the circumferential direction, and the respective protrusion 102 projecting radially inward from the respective main body 101 of each pole, especially using the respective protrusion 102 to compensate for a gradient of the spacing between respective two poles in each pair of poles in each dual-pole field deflector which spacing changes from the central portions of the respective two poles towards the end portions thereof, which gradient is caused by the arrangement in which respective two main bodies 101 of two poles 100 in each pair are disposed opposite to each other in the circumferential direction; and both shapes and arrangement of the various poles 100 (especially their respective main bodies 101) are relatively simple, facilitating ensuring both manufacturing simplicity and assembly accuracy.

Further by way of example, as illustrated in FIG. 1, the respective two main bodies 101 of each pair of poles 100 in the at least two pairs of poles extend across an equivalent radian and have a same shape, respectively, in a circumferential direction of the respective two main bodies, and have a same inner radius at respective radial inner sides and a same outer radius at respective radial outer sides; and respective main bodies 101 of the at least two pairs of poles 100 are spaced apart from one another angularly and circumferentially, and are arranged to be in rotational symmetry with reference to one another, and respective poles in each pair of poles have central symmetry with reference to each other.

Further by way of example, as illustrated in FIG. 1, the respective main bodies 101 of the at least two pairs of poles 100 extend across an equivalent radian and have a same shape, respectively, in a same circumference defined collectively by the respective main bodies, and have a same inner radius at respective radial inner sides and a same outer radius at respective radial outer sides; and the respective main bodies 101 of the at least two pairs of poles 100 are spaced apart from one another angularly in the same circumference of the respective main bodies.

With such a setting, the respective secondary deflection fields generated by all of the dual-pole field deflectors in the multi-pole deflector 1 have a same magnitude, respectively, facilitating both calculation and control of the resultant deflection field.

Further by way of example, as illustrated in FIG. 1, the respective main bodies 101 of the at least two pairs of poles 100 are arranged to space apart from one another at a same angle circumferentially.

With such a setting, essentially, respective poles 100 of the multi-pole deflector 1, in particular the respective main body 101 in the respective poles 100, are arranged to spaced apart from one another at an equal angle in the circumferential direction, that is, arranged in a way of equally dividing the circumference, such that the respective secondary deflection fields generated by the dual-pole deflectors are respectively arranged in a roughly uniform distribution throughout the inside of the through hole 103 (especially in the paraxial region next to the optical axis Z) which is at least partially encompassed and delimited by the various poles 100 of the multi-pole deflector 1, further facilitating a better uniformity of the resultant deflection field.

Further by way of example, as illustrated in FIG. 1, the at least two pairs of poles comprise just two pairs of poles alternately spaced apart from one another at an angle of 90°. In other words, the multi-pole deflector 1 comprises four poles 100 arranged orthogonally to one another, that is, two dual-pole field deflectors arranged orthogonal to each other. In other words, the multi-pole deflector is shaped into a quadrupole deflector.

With such a setting, the off-axis aberration introduced when the charged particle beam passes through the through-hole 103 of the multi-pole deflector 1 is reduced, and the multi-pole deflector is also realized with the minimum number of poles 100 and the minimum number of feed ports required by the poles 100, thereby simplifying the structure design and ensuring the simplicity of processing and manufacturing and the assembly accuracy.

For example, respective protrusions 102 of the at least two pairs of poles are shaped and dimensioned to minimize an off-axis aberration of the charged particle beam being incident on the deflector 1 and entering and passing through the through-hole of the deflector.

Specifically, for example, each of the respective protrusions 102 of each pair of poles extends circumferentially across an angle which fails to exceed a predetermined angle range as a threshold angle range, and projects from respective radial inner side of respective main body at a distance which fails to exceed a predetermined radial distance as a threshold radial distance.

The shapes and dimensions of the protrusions 102, especially a radian angle A across which each of the protrusions 102 correspondingly spans in the circumferential direction, may be of vital importance to the uniformity of the resultant deflection field generated by the multi-pole deflector 1 in the paraxial region.

Specifically, in a condition that a radius R2 of each of the respective main bodies at respective radial inner side is given, and a ratio of a maximum length L3 of each of the protrusions 102 projecting from the inner side of respective main body 101 and in turn continuing extending radially inwards with reference to the radius R2 of each of the respective main bodies 101 is constant/fixed, the smaller the radian angle is, the smaller a circumferential range of the respective protrusion 102 is (i.e., the narrower the respective protrusion 102 in the circumferential direction is), and then the larger a degree of approximation how the shape and dimension of each pole 100 approximate to those of a pole having no respective protrusion 102 is, and the less obvious a compensation effect of each protrusion on a change of the spacing between respective two poles in each pair of poles 100 due to the circumferential arrangement of the poles 100 is, accordingly. On the contrary, the bigger the radian angle is, the larger the circumferential range on the respective main body 101 of each of the respective poles 100 which is occupied by the respective protrusion 102 is (i.e., the wider the respective protrusion 102 in the circumferential direction is), and then the larger a degree of approximation how each pair of poles may be approximately equivalent to a pair of plate-like poles parallel to each other is, accordingly; as such, an effect of decreasing the influence of the distortion of the field lines of the respective secondary deflection fields of individual dual-pole deflectors in the multi-pole deflector 1 at edges as compared with the field lines at center thereof, on the charged particle beam or secondary charged particle beam passing through the axial through-hole 103 of the multi-pole deflector, by the arrangement in which respective two main bodies 101 of two poles 100 in each pair in the multi-pole deflector 1 are disposed opposite to each other in the circumferential direction, is less obvious.

In the multi-pole deflector, it is usually focused on the distribution of the deflection field thereof in the paraxial region next to the optical axis. It is indicated by a numerical simulation that, for a given radius R2 of each of the respective main bodies 101 at respective radial inner side thereof, a transverse field distribution which relatively approximates to a distribution of a dual-pole field may be obtained in a relatively larger range in the paraxial region correspondingly, by adopting a combinatorial optimization of both the maximum length L3 of each of the protrusions 102 projecting from the inner side of respective main body 101 and in turn continuing extending radially inwards and the radian A of each of the protrusions 102.

By way of example, the predetermined angle range of the radian angle A is 5° to 40° and the predetermined radial distance is between 0.1 and 0.9 times of the respective inner radius at respective radial inner sides of the respective main bodies of each pair of poles. As such, in case of such a dimensional setting, it is possible to obtain a maximum distribution of the resultant deflection field equivalent to a distribution of a dual-pole field in the paraxial region next to the optical axis Z, throughout the inside of the through-hole 103 of the quadrupole field deflector as illustrated in FIG. 1.

Further, for example, as illustrated in FIG. 1, each of the respective protrusions 102 of each pair of poles is shaped to be in the form of a boss which projects from the respective radial inner side of the respective main body 101 of the respective pole 100 and is provided with an arc-shaped concave top portion. The maximum length L3 of each of the protrusions 102 of each pair of poles projecting from the inner side of respective main body 101 and in turn continuing extending radially inwards is a radius R3 at the arc-shaped concave top portion of the boss. Thus, for a given radius R2 of each of the respective main bodies 101 at respective radial inner side thereof, a transverse field distribution which relatively approximates to a distribution of a dual-pole field may be obtained in a relatively larger range in the paraxial region correspondingly, by adopting a combinatorial optimization of both the radius R3 at the arc-shaped concave top portion of the boss and the radian A of each of the protrusions 102.

Figure 4A:
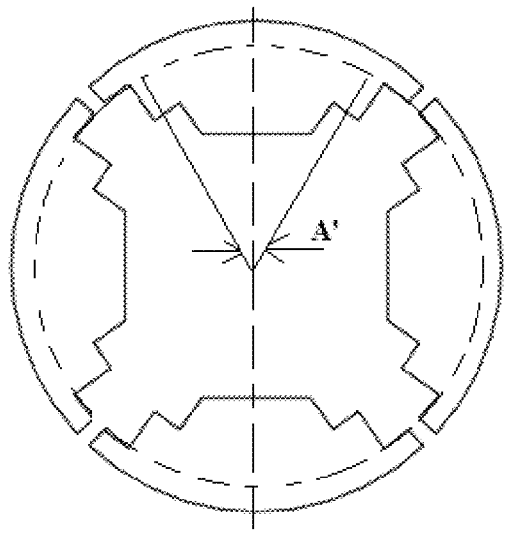
FIG. 4(a) illustrates a schematic structural view of an alternative multi-pole deflector for charged particles according to another embodiment of the present disclosure, schematically showing that each of the protrusions in the respective schematic structures of various poles is specifically in the form of a multi-stage stepped boss which projects from the respective radial inner side of a main body of the respective pole and is provided with a flat top portion.
Figure 4B:
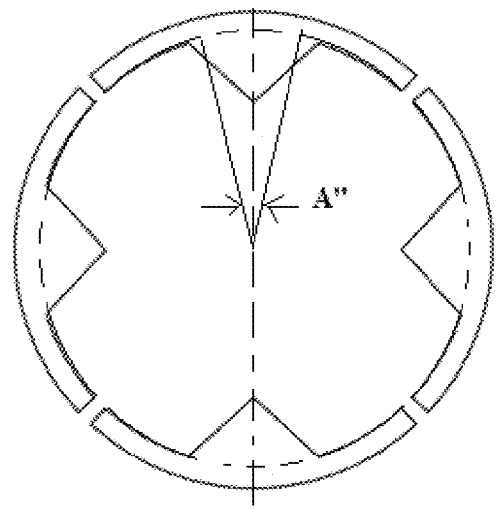
FIG. 4(b) illustrates a schematic structural view of an alternative multi-pole deflector for charged particles according to another embodiment of the present disclosure, schematically showing that each of the protrusions in the respective schematic structures of various poles is specifically in the form of a partial pyramid shape which projects from the respective radial inner side of a main body of the respective pole and is provided with a convex and sharpened top portion.
Figure 4C:
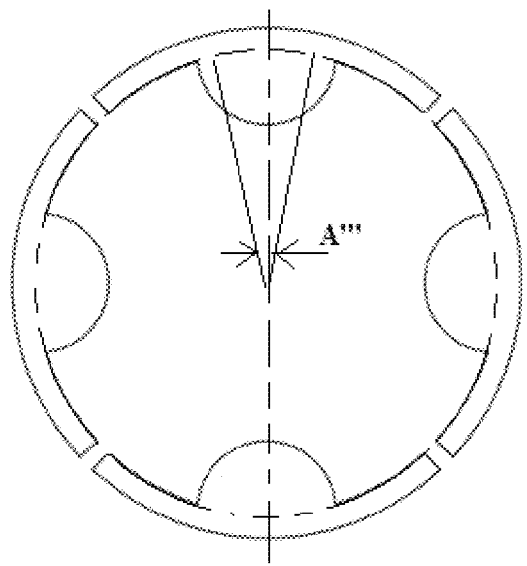
FIG. 4(c) illustrates a schematic structural view of an alternative multi-pole deflector for charged particles according to another embodiment of the present disclosure, schematically showing that each of the protrusions in the respective schematic structures of various poles is specifically in the form of a partial sphere shape which projects from the respective radial inner side of a main body of the respective pole and is provided with a convex and domed top portion.

For example, as illustrated in FIG. 4(a), FIG. 4(b) and FIG. 4(c), other alternative forms of the projections 102 are shown. For example, FIG. 4(a) illustrates a schematic structural view of an alternative multi-pole deflector for charged particles according to another embodiment of the present disclosure, schematically showing that each of the protrusions in the respective schematic structures of various poles is specifically in the form of a multi-stage stepped boss which projects from the respective radial inner side of a main body of the respective pole and is provided with a flat top portion; FIG. 4(b) illustrates a schematic structural view of an alternative multi-pole deflector for charged particles according to another embodiment of the present disclosure, schematically showing that each of the protrusions in the respective schematic structures of various poles is specifically in the form of a partial pyramid shape which projects from the respective radial inner side of a main body of the respective pole and is provided with a convex and sharpened top portion; and FIG. 4(c) illustrates a schematic structural view of an alternative multi-pole deflector for charged particles according to another embodiment of the present disclosure, schematically showing that each of the protrusions in the respective schematic structures of various poles is specifically in the form of a partial sphere shape which projects from the respective radial inner side of a main body of the respective pole and is provided with a convex and domed top portion.

Specifically, for example, each of the respective protrusions of each pair of poles is shaped to be in the form of one of a partial sphere, a partial cone and a partial pyramid projecting from the respective radial inner side of the respective main body of the respective pole and is provided with a convex top portion; or alternatively, each of the respective protrusions of each pair of poles is shaped to be in the form of one of a truncated frustum of a cone, a truncated spherical segment, a frustum, and a multi-stage stepped boss projecting from the respective radial inner side of the respective main body of the respective pole and is provided with a flat top portion.

Accordingly, the predetermined angle range of the radian angle A', A''' and A''' as illustrated in FIG. 4(a), FIG. 4(b) and FIG. 4(c) (as marked therein) for respective protrusions of each pair of poles is equal to a radian angle range occupied by each of a pair of imaginary protrusions used instead of the respective protrusions in the pair of poles, such that a pair of poles alternatively having the pair of imaginary protrusions, each of which is in the form of a boss projecting from the respective radial inner side of the respective main body and is provided with an arc-shaped concave top portion, generate an imaginary secondary deflection field equivalent to the secondary deflection field as generated practically by the pair of poles having the respective protrusions other than the pair of imaginary protrusions; in other words, the arc angle occupied by the boss is the equivalent radian angle of the equivalent arc boss calculated depending on respective secondary deflection field.

In an exemplary embodiment in the embodiments of the disclosure, by way of example, a multi-electrode electrostatic deflector functions as the multi-pole deflector for charged particle beam.

Figure 2A:
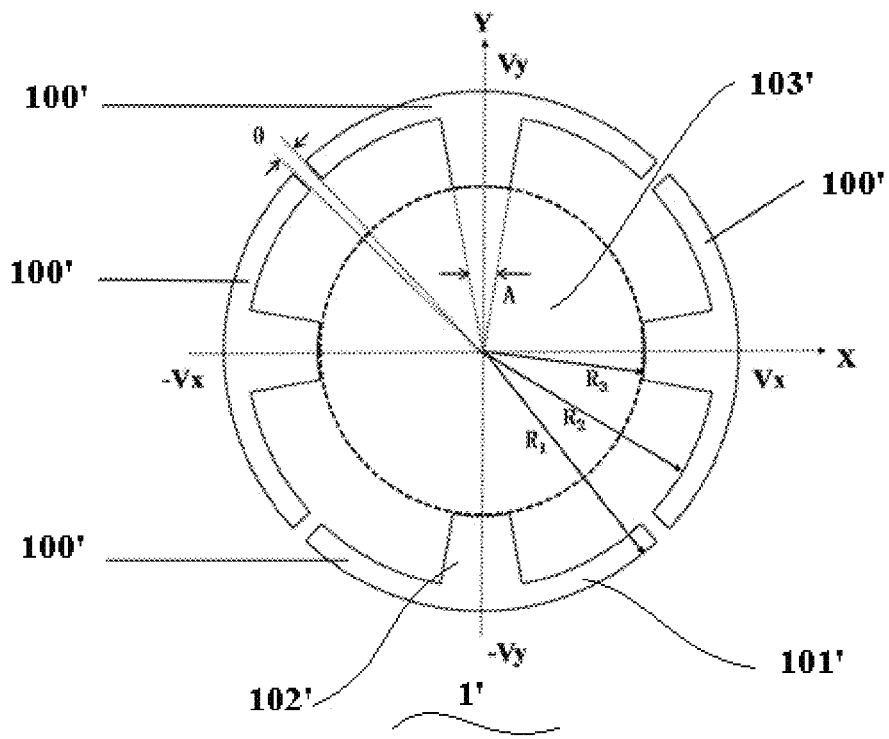
FIG. 2(a) illustrates a schematic structural view of a multi-pole electrostatic deflector based on the schematic structure and arrangement of various poles as illustrated in FIG. 1.

FIG. 2 (a) illustrates a schematic structural view of a multi-pole electric deflector based on the schematic structure and arrangement of various poles as illustrated in FIG. 1; FIG. 2 (b) illustrates a schematic diagram of distribution status of electric field lines in the multi-pole electrostatic deflector in use as illustrated in FIG. 2(a).

As illustrated in FIG. 2(a), the multi-electrode electrostatic deflector 1' comprises: at least two pairs of electrodes 100' formed by a conductive material (such as metal or alloy material, graphite electrode material, or conductive oxide like ITO, or the like), each electrode 100' in each pair of electrodes comprising: a main body 101' constructed in the form of a circular arc-shaped section; and a protrusion 102' projecting from an radial inner side of the main body 101'. Respective two main bodies 101' of each pair of electrodes 100' are arranged concentrically with each other and diametrically opposite to each other, and the at least two pairs of electrodes 100' at least partially encompass and delimit a through-hole 103' thereamong (i.e., an axial through-hole 103'), which opens axially and is configured to receive the charged particle beam to be deflected and to pass therethrough deflected charged particle beam; and electrodes in pairs of the at least two pairs of electrodes 100' of the electric deflector 1' cooperate to generate respective secondary deflection fields distributed within the through-hole and across an internal space defined within the through-hole, respectively, and the secondary deflection fields are synthesized by combination of vectors into a resultant deflection electric field of the electric deflector which is distributed within and across the through-hole 103' and is configured to deflect the charged particle beam passing therethrough. In the multi-electrode electrostatic deflector 1', each pair of electrodes (i.e. each dual-pole field electric deflector) generates a respective secondary electric field when the two opposite electrodes are respectively applied with respective external bias voltage(s), and the secondary electric field vectors of the pairs of electrodes are synthesized into the resultant deflection electric field of the multi-pole electrostatic deflector 1'.

As described above, on the one hand, respective two main bodies 101' of each pair of electrodes in the at least two pairs of electrodes 100', are each in the form of a circular arc-shaped section and are arranged concentrically with respect to the optical axis Z, and are arranged diametrically opposite. As such, the influence of the distortion of the field lines of the respective secondary deflection fields of individual dual-electrode electric deflectors in the multi-electrode electrostatic deflector 1' at edges as compared with the field lines at center thereof, on the charged particle beam or secondary charged particle beam passing through the axial through-hole 103' of the multi-electrode electrostatic deflector is minimized, with aforementioned arrangement in which respective two main bodies 101' of two electrodes 100' in pair are disposed opposite to each other in the circumferential direction.

On the other hand, as described above, each electrode 100' is also provided with a respective protrusion 102' projecting radially inwards from the radial inner side of its main body 101'. By providing the protrusion 102' projecting radially inward from the respective main body 101' of each electrode, a difference between a spacing between respective central portions of respective two electrodes 100' in each pair of electrodes (such a spacing would have been relatively larger without the protrusion) and another spacing between respective end portions of respective two electrodes 100' in each pair of electrodes (such another spacing is relatively smaller, as compared with the distance between respective central portions without the protrusion) may be decreased substantially to an extent. In other words, a gradient of the spacing between respective two electrodes in each pair of electrodes in each dual-electrode field electric deflector which changes from the central portions of the respective two electrodes towards the end portions thereof, will be decreased. As such, the significant change of the spacing between the respective two electrodes in each pair of electrodes 100' which is caused by the arrangement of the electrodes in the circumferential direction is compensated for, facilitating improving the uniformity of the resultant deflection electric field generate by the multi-electrode electrostatic deflector in a paraxial region next to the optical axis Z.

Therefore, it can be seen that, the uniformity of the resultant deflection electric field generated by the multielectrode electrostatic deflector within the through-hole 103' which is at least partially encompassed and delimited by the various electrodes 100' of the multi-electrode electrostatic deflector 1' (especially in the paraxial region next to the optical axis Z) is improved, by a cooperation between two aspects of settings, i.e., the arrangement in which respective two main bodies 101' of two electrodes 100' in each pair are disposed opposite to each other in the circumferential direction, and the respective protrusion 102' projecting radially inward from the respective main body 101' of each electrode, especially using the respective protrusion 102' to compensate for a gradient of the spacing between respective two electrodes in each pair of electrodes in each dualelectrode field electric deflector which spacing changes from the central portions of the respective two electrodes towards the end portions thereof, which gradient is caused by the arrangement in which respective two main bodies 101' of two electrodes 100 in each pair are disposed opposite to each other in the circumferential direction; and both shapes and arrangement of the various electrodes 100' (especially their respective main bodies 101') are relatively simple, facilitating ensuring both manufacturing simplicity and assembly accuracy.

Further by way of example, as illustrated in FIG. 2(a), the multi-electrode electrostatic deflector may also adopt various exemplary configurations of the multi-electrode electrostatic deflector for the charged particle beam as illustrated in FIG. 1, which will not be repeatedly set forth here.

Specifically, for example, an application example of the present disclosure is illustrated in FIG. 2(a), illustrating a quadruple-electrode electrostatic deflector. As far as the quadruple-electrode electrostatic deflector is concerned, in geometric structure thereof, for the optical axis (Z-axis), there are four plane symmetries each plane containing the Z axis; and in feeding distribution thereof, there are features of one plane symmetry and one plane anti-symmetry. Respective arc-shaped main bodies of the four electrodes 100' are shaped to be electrodes each being in the form of circular arc-shaped section having an outer radius R1 and an inner radius R2 which is less than R1, respectively, and are spaced apart from one another at a same gap occupying an equal radian circumferentially, i.e., with a gap angle θ between adjacent electrodes (i.e., an inter-polar gap angle θ). On this basis, on the radial inner side of the main body of each electrode, there is also provided with a boss-shaped structure having an arc-shaped concave top portion, which has its inner radius of R3 (less than R2) and its radian of A. Voltages Vy, −Vx, −Vy, Vx are applied on the electrodes 100' sequentially in the circumferential direction, respectively (i.e., in counter-clockwise direction from +Y direction, as illustrated); i.e., voltages Vy, −Vy and Vx, −Vx are applied in pairs on respective two electrodes in two pairs respectively as illustrated. The deflection electric field mainly along the radial direction is obtained in the paraxial area as in the cross section shown in the Figure, with an radian a formed between this direction and the X axis being determined by a calculation of arctan(Vy/Vx), as illustrated in FIG. 2(b) which shows a diagram of the distribution status of electric field lines of the resultant electric field in practical application of the multi-pole deflector.

Figure 2B:
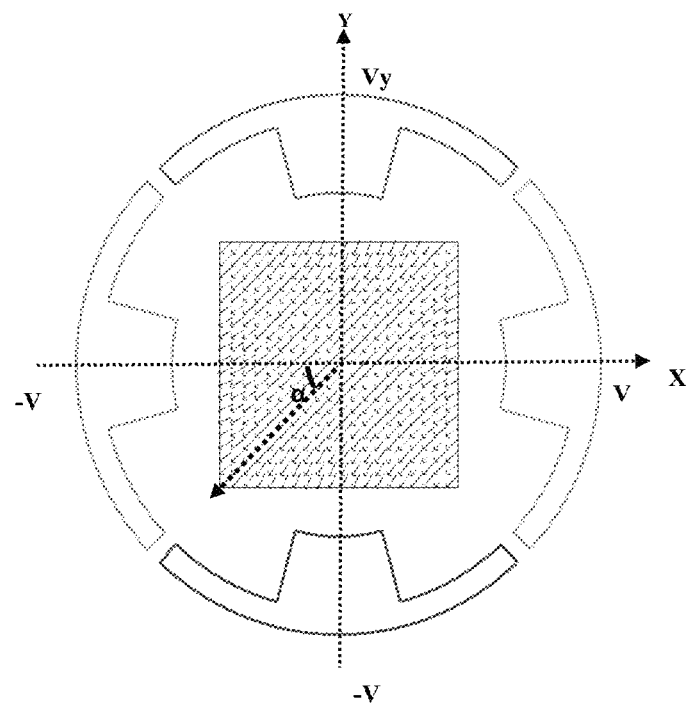
FIG. 2(b) illustrates a schematic diagram of distribution status of electric field lines in the multi-pole electrostatic deflector in use as illustrated in FIG. 2(a)

It can be seen from FIG. 2(b) that the distribution status of the electric field lines in the paraxial region is substantially uniform, and the electric field lines are distributed depending on the shapes of the electrodes and the voltages applied on the electrodes. It is indicated by a numerical simulation that, for a given radius R2 of each of the respective main bodies 101, a transverse field distribution which relatively approximates to a distribution of a dual-pole field may be obtained in a relatively larger range in the paraxial region correspondingly, by adopting a combinatorial optimization of both the radius R3 at the arc-shaped concave top portion of the boss and the radian A of each of the protrusions 102.

Figure 2C:
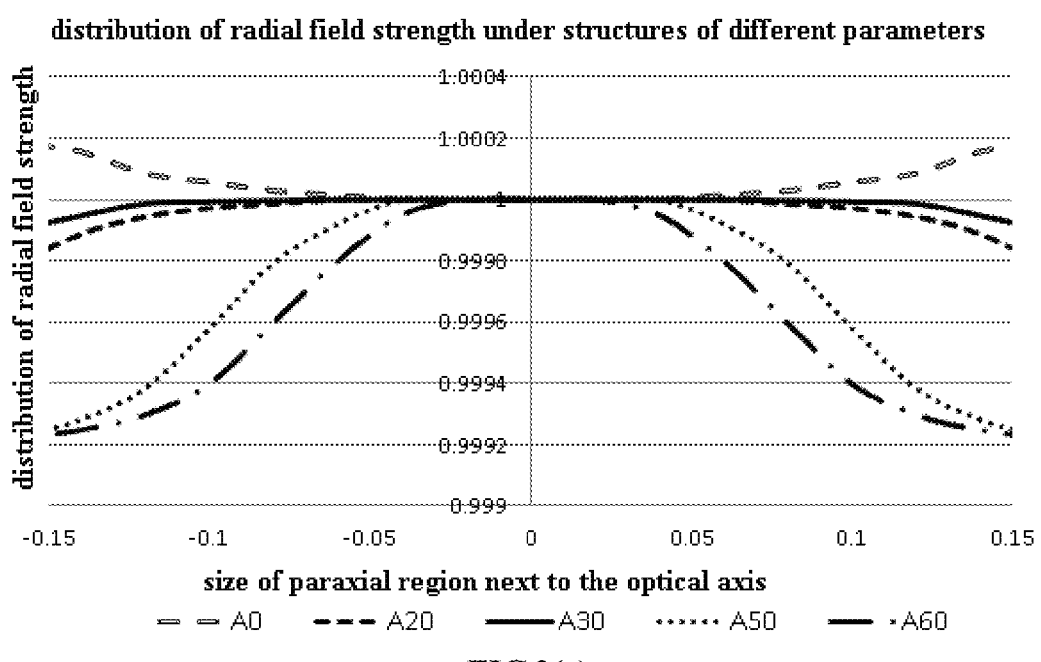
FIG. 2(c) illustrates a diagram of distribution status of electric field intensity of a radial deflection field falling within a paraxial region of the multi-pole electrostatic deflector as illustrated in FIG. 2(a) on condition of different boss parameters (e.g., R3/R2=0.7), wherein a horizontal axis in FIG. 3 denotes a size (labeled by 'r') of the paraxial region and a vertical axis in FIG. 3 denotes a size (labeled by 'Er') of the radial field.
Figure 3A:
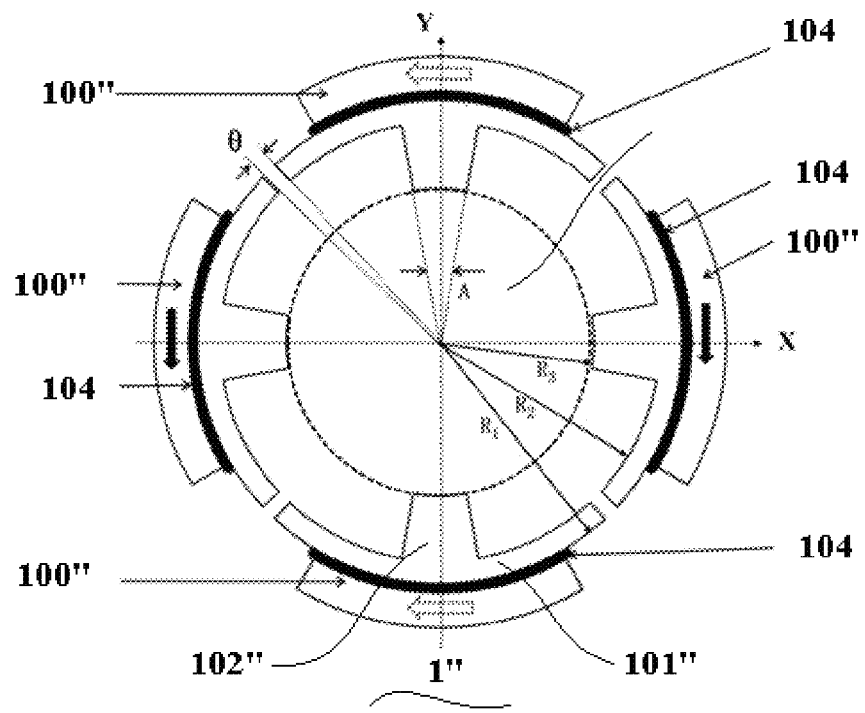
FIG. 3(a) shows a schematic structural view of a multi-pole magnetic deflector based on the schematic structure and arrangement of various poles as illustrated in FIG. 1.
Figure 3B:
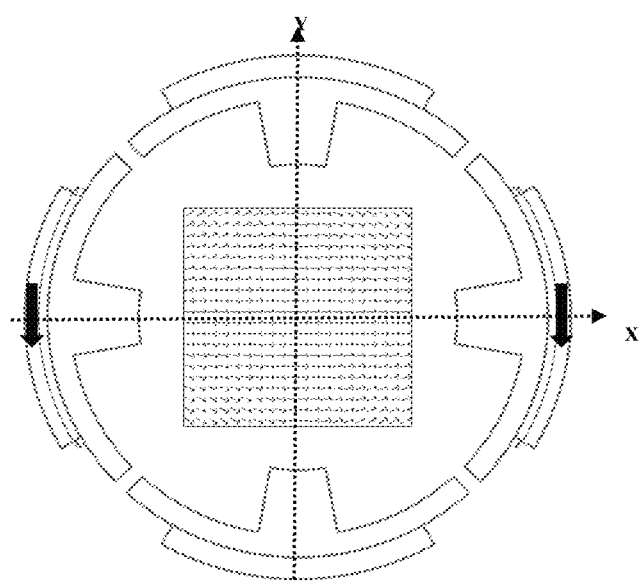
FIG. 3(b) illustrates a schematic diagram of distribution status of magnetic field in the multi-pole electric deflector in use as illustrated in FIG. 3(a)
Figure 3C:
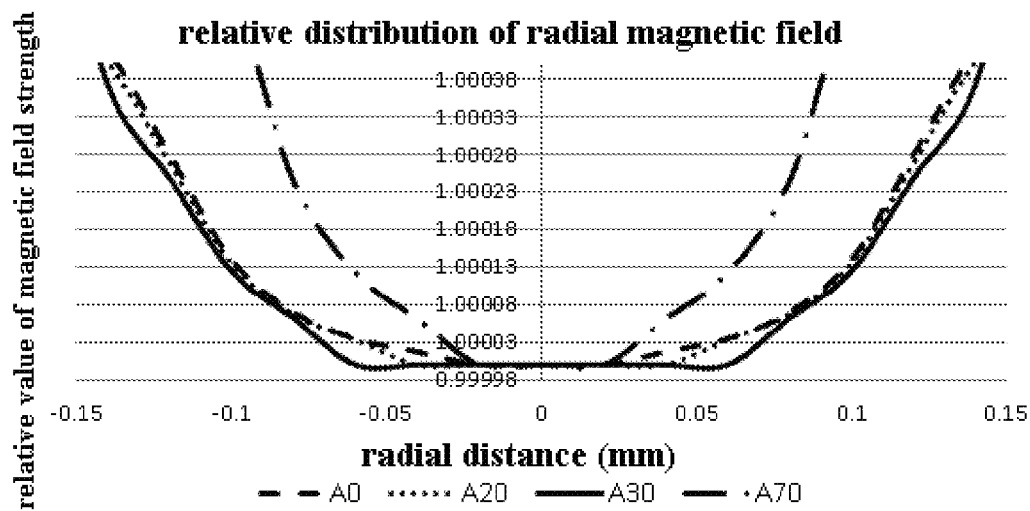
FIG. 3(c) illustrates a diagram of distribution status of electric field intensity of a radial deflection magnetic field falling within a paraxial region of the multi-pole magnetic deflector as illustrated in FIG. 3(a) on condition of different boss parameters (e.g., R3/R2=0.7), wherein a horizontal axis for the curves in FIG. 3 denotes a size (labeled by 'r') of the paraxial region and a vertical axis in FIG. 3 denotes a size (labeled by 'Br') of the radial magnetic field.

FIG. 2(c) illustrates a diagram of distribution status of electric field intensity of a radial deflection field falling within a paraxial region of the multi-pole electrostatic deflector as illustrated in FIG. 2(a) on condition of different boss parameters (e.g., R3/R2=0.7), wherein a horizontal axis in FIG. 3 denotes a size (labeled by 'r') of the paraxial region and a vertical axis in FIG. 3 denotes a size (labeled by 'Er') of the radial field. The experimental data as practically detected may indicate that, in a condition of R3/R2=0.7, and in case that the angle A of the boss is equal to 30° (see Figure line A 30 as illustrated in FIG. 2(c)), the uniformity of deflection of the electric field is better than that under other structural parameters, in the range of 300 um in the paraxial region. It can also be seen from FIG. 3(c) that, as compared with a multi-pole electric deflector structure without boss (i.e. an electrostatic deflector in relevant art, corresponding to the figure line of A0 in FIG. 2(c)), the uniformity of deflection electric field of electrostatic deflectors as illustrated in FIG. 2(a) and FIG. 2(b) in the embodiment of the disclosure is better than that of quadruple-electrode electrostatic deflector structure without radial inner boss as in relevant art; especially, figure lines A20 and A30 indicate that, as compared with figure line A0, there is a relatively larger range of the figure lines A20 and A30 on the horizontal coordinate axis corresponding to a value approximately equal to the reference value 1 of the relative field strength on the vertical coordinate axis (a value of the field strength of the resultant deflection field at the optical axis is 1, which serves as the reference value, and vertical coordinate values of the figure lines are the relative ratio of specific field strengths at various point relative to the reference value 1, respectively). In case of a same deflection aberration, the electrostatic deflector of the embodiment of the present disclosure has a larger field of view, as compared with a quadruple-electrode electrostatic deflector without radial inner boss as in relevant art.

And the embodiments of the present disclosure can be extended to more general application examples. For example, the outer radius R2 of the boss being in the range of 3~100 mm, the inner radius R3 of the boss being in the range of 0.1R2~0.9R2, and the radian value A of the boss in the range of 5°~40°, all fall into the scope of protection as claimed in the present disclosure.

In another exemplary embodiment in the embodiments of the disclosure, by way of example, a multi-pole magnetic deflector functions as the multi-pole deflector for a charged particle beam.

FIG. 3(a) shows a schematic structural view of a multi-pole magnetic deflector based on the schematic structure and arrangement of various poles as illustrated in FIG. 1; FIG. 3(b) illustrates a schematic diagram of distribution status of magnetic field in the multi-pole electric deflector in use as illustrated in FIG. 3(a).

As illustrated in FIG. 3(a), the multi-magnetic pole magnetic deflector 1" comprises: at least two pairs of magnetic poles 100" formed by a magnetically permeable material (also referred to as "magnetic conductive material", for example a soft magnetic material, such as ferrosilicon, soft magnetic ferrite, or the like), each magnetic pole 100" in each pair of magnetic poles comprising: a main body 101" constructed in the form of a circular arc-shaped section; a protrusion 102" projecting from an radial inner side of the main body 101"; and an excitation coil 104 attached on a radial side (e.g., a radial outer side or the radial inner side) of the magnetic pole 100", with respective excitation current flowing in the excitation coil 104 in a same direction, as illustrated in FIG. 3(a), where solid line arrows therein indicating a front side flowing direction while dotted line arrows therein indicating a back side flowing direction. Respective two main bodies 101" of each pair of magnetic poles 100" are arranged concentrically with each other and diametrically opposite to each other, and the at least two pairs of magnetic poles 100" at least partially encompass and delimit a through-hole 103" thereamong (i.e., an axial through-hole 103"), which opens axially and is configured to receive the charged particle beam to be deflected and to pass therethrough deflected charged particle beam; and magnetic poles in pairs of the at least two pairs of magnetic poles 100" of the magnetic deflector 1" cooperate to generate respective secondary deflection fields distributed within the through-hole and across an internal space defined within the through-hole, respectively, and the secondary deflection fields are synthesized by combination of vectors into a resultant deflection magnetic field of the magnetic deflector which is distributed within and across the through-hole 103" and is configured to deflect the charged particle beam passing therethrough. In the multi-magnetic pole magnetic deflector 1", each pair of magnetic poles (i.e. each dual-pole field magnetic deflector) generates a respective secondary magnetic field when the excitation current passes through the respective excitation coil, and the secondary magnetic field vectors of the pairs of magnetic poles are synthesized into the resultant deflection magnetic field of the multi-pole magnetic deflector 1".

As described above, on the one hand, respective two main bodies 101" of each pair of magnetic poles in the at least two pairs of magnetic poles 100", are each in the form of a circular arc-shaped section and are arranged concentrically with respect to the optical axis Z, and are arranged diametrically opposite. As such, the influence of the distortion of the field lines of the respective secondary deflection fields of individual dual-magnetic pole magnetic deflectors in the multi-magnetic pole magnetic deflector 1" at edges as compared with the field lines at center thereof, on the charged particle beam or secondary charged particle beam passing through the axial through-hole 103" of the multi-magnetic pole magnetic deflector is minimized, with aforementioned arrangement in which respective two main bodies 101" of two magnetic poles 100" in pair are disposed opposite to each other in the circumferential direction.

On the other hand, as described above, each magnetic pole 100" is also provided with a respective protrusion 102" projecting radially inwards from the radial inner side of its main body 101". By providing the protrusion 102" projecting radially inward from the respective main body 101" of each magnetic pole, a difference between a spacing between respective central portions of respective two magnetic poles 100" in each pair of magnetic poles (such a spacing would have been relatively larger without the protrusion) and another spacing between respective end portions of respective two magnetic poles 100" in each pair of magnetic poles (such another spacing is relatively smaller, as compared with the distance between respective central portions without the protrusion) may be decreased substantially to an extent. In other words, a gradient of the spacing between respective two magnetic poles in each pair of magnetic poles in each dual-magnetic pole field magnetic deflector which changes from the central portions of the respective two magnetic poles towards the end portions thereof, will be decreased. As such, the significant change of the spacing between the respective two magnetic poles in each pair of magnetic poles 100" which is caused by the arrangement of the magnetic poles in the circumferential direction is compensated for, facilitating improving the uniformity of the resultant deflection magnetic field generate by the multi-magnetic pole magnetic deflector in a paraxial region next to the optical axis Z.

Therefore, it can be seen that, the uniformity of the resultant deflection magnetic field generated by the multi-magnetic pole magnetic deflector within the through-hole 103" which is at least partially encompassed and delimited by the various magnetic poles 100" of the multi-magnetic pole magnetic deflector 1" (especially in the paraxial region next to the optical axis Z) is improved, by a cooperation between two aspects of settings, i.e., the arrangement in which respective two main bodies 101" of two magnetic poles 100" in each pair are disposed opposite to each other in the circumferential direction, and the respective protrusion 102" projecting radially inward from the respective main body 101" of each magnetic pole, especially using the respective protrusion 102" to compensate for a gradient of the spacing between respective two magnetic poles in each pair of magnetic poles in each dual-magnetic pole field magnetic deflector which spacing changes from the central portions of the respective two magnetic poles towards the end portions thereof, which gradient is caused by the arrangement in which respective two main bodies 101" of two magnetic poles 100" in each pair are disposed opposite to each other in the circumferential direction; and both shapes and arrangement of the various magnetic poles 100" (especially their respective main bodies 101") are relatively simple, facilitating ensuring both manufacturing simplicity and assembly accuracy.

Further by way of example, as illustrated in FIG. 3(*a*), the multi-magnetic pole magnetic deflector may also adopt various exemplary configurations of the multi-electrode electrostatic deflector for the charged particle beam as illustrated in FIG. 1, which will not be repeatedly set forth here.

Specifically, for example, an application example of the present disclosure is illustrated in FIG. 3(*a*), illustrating a quadruple-pole magnetic deflector. The shape of the boss on a radial inner surface of each of the magnetic poles may still be described with parameters such as the outer radius R1 of the respective main body, the inner radius R2 of the respective main body, the inner radius R3 of the boss, and the radian angle A of the boss. With the excitation of a certain current in the excitation coils, the deflection magnetic field which distributed radially is obtained in the paraxial region in the cross section. As illustrated in FIG. 3(*b*), for example, it illustrates an example of distribution status of magnetic field in radial direction in a condition that merely a group of coils (606 and 608) are excited. As illustrated in FIG. 3(*b*), it shows a diagram of the distribution status of magnetic field lines of the resultant magnetic field in practical application of the multi-pole deflector.

It can be seen from FIG. 3(*b*) that the distribution status of the magnetic field lines in the paraxial region is substantially uniform, and the magnetic field lines are distributed depending on the shapes of the magnetic poles and the voltages applied on the magnetic poles. It is indicated by a numerical simulation that, for a given radius R2 of each of the respective main bodies 101, a transverse field distribution which relatively approximates to a distribution of a dual-pole field may be obtained in a relatively larger range in the paraxial region correspondingly, by adopting a combinatorial optimization of both the radius R3 at the arc-shaped concave top portion of the boss and the radian A of each of the protrusions 102.

FIG. 3(*c*) illustrates a diagram of distribution status of magnetic field intensity of a radial deflection magnetic field falling within a paraxial region of the multi-pole magnetic deflector as illustrated in FIG. 3(*a*) on condition of different boss parameters (e.g., R3/R2=0.7), wherein a horizontal axis for the figure lines in FIG. 3 denotes a size (labeled by 'r') of the paraxial region and a vertical axis in FIG. 3 denotes a size (labeled by 'Br') of the radial magnetic field. The experimental data as practically detected may indicate that, in a condition of R3/R2=0.7, and in case that the angle A of the boss is equal to 30° (see Figure line A 30 as illustrated in FIG. 3(*c*)), the uniformity of deflection of the magnetic field is better than that under other structural parameters, in the range of 300 um in the paraxial region. It can also be seen from FIG. 3(*c*) that, as compared with a multi-pole magnetic deflector structure without boss (i.e. an magnetic deflector in relevant art, corresponding to the figure line of A0 in FIG. 3(*c*)), the uniformity of deflection magnetic field of magnetic deflectors as illustrated in FIG. 3(*a*) and FIG. 3(*b*) in the embodiment of the disclosure is better than that of quadruple-pole magnetic deflector structure without radial inner boss as in relevant art; especially, figure lines A20 and A30 indicate that, as compared with figure line A0, there is a relatively larger range of the figure lines A20 and A30 on the horizontal coordinate axis corresponding to a value approximately equal to the reference value 1 of the relative magnetic field strength/intensity on the vertical coordinate axis (a value of the magnetic field strength/intensity of the resultant deflection field at the optical axis is 1, which serves as the reference value, and vertical coordinate values of the figure lines are the relative ratio of specific field strengths at various point relative to the reference value 1, respectively). In case of a same deflection aberration, the magnetic deflector of the embodiment of the present disclosure has a larger field of view, as compared with a quadruple-pole magnetic deflector without radial inner boss as in relevant art. And the embodiments of the present disclosure can be extended to more general application examples. For example, the outer radius R2 of the boss being in the range of 3~100 mm, the inner radius R3 of the boss being in the range of 0.1R2~0.9R2, and the radian value A of the boss in the range of 5°~40°, all fall into the scope of protection as claimed in the present disclosure.

Figure 5:
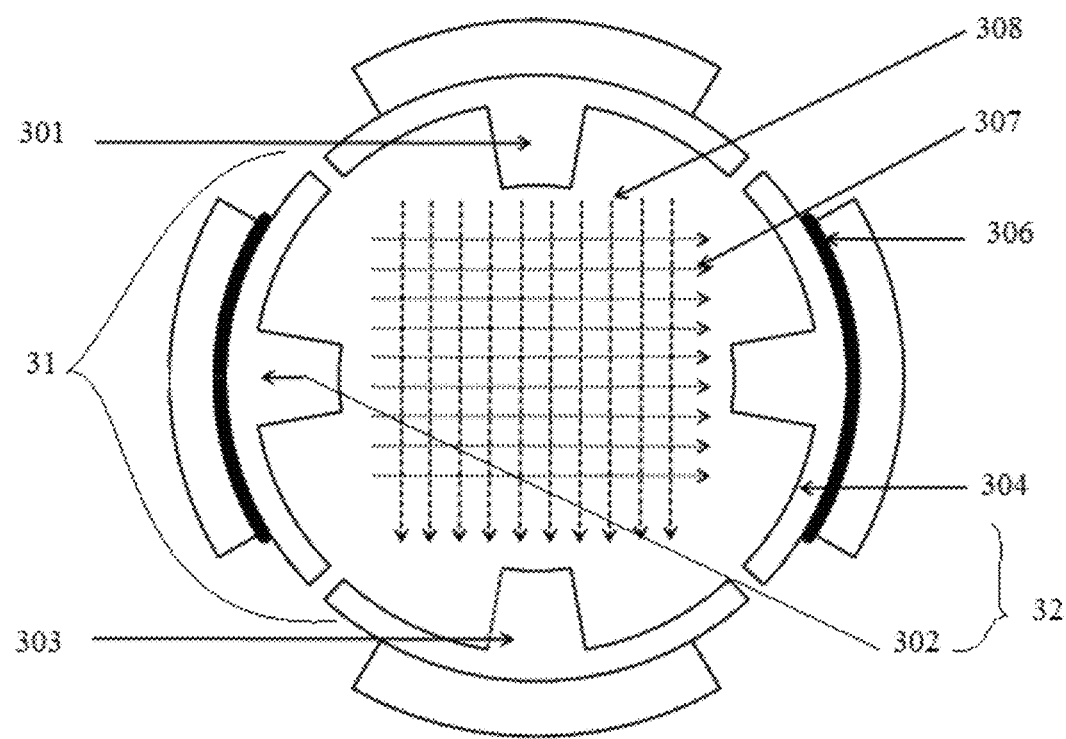
FIG. 5 illustrates a schematic structural view of a Wien filter according to an embodiment of the present disclosure.

FIG. 5 illustrates a schematic structural view of a Wien filter according to an embodiment of the present disclosure.

In another aspect of the present disclosure, as illustrated in FIG. 5, a Wien filter 3 for charged particles such as secondary electrons is provided. The Wien filter 3 is, for example, constructed as a composite deflector comprising electrostatic deflectors and magnetic deflectors (both types are arranged to cross each other; more specifically, for example, orthogonal to each other), thereby generating electric and magnetic fields (crossing each other; more specifically, for example, orthogonal to each other) which cooperate with each other to deflect the charged particles depending on respective masses, moving directions, charges and the like of the charged particles in the charged particle beam incident onto and entering the deflection field generated by the deflector. In other words, the Wien filter, for example, is a multi-pole field generating component, which is composed of a group of electric deflectors and magnetic deflectors and is configured to generate on-axis deflection electric field and deflection magnetic field both of which are arranged in an orthogonal distribution relative to each other, and it can separate the charged particles depending on respective masses, moving directions, charges and the like of the charged particles, so as to achieve a screening effect for the charged particles. Therefore, the Wien filter is often used for monochromatic filtering of charged particles, and filtering detection for particles having specific energy or mass.

In practical applications, the Wien filter 3 is used, for example, in a charged particle beam imaging apparatus such as a scanning electron microscope and the like, and acts on both primary and secondary electron beams. Specifically, the Wien filter is for example configured to separate the secondary electrons functioning as the secondary charged particles, depending on respective masses, moving directions, charges and the like of the secondary electrons, so as to achieve the effect of screening the secondary electrons. As such, the detector can receive more secondary electrons, thus improving the imaging quality of images of the secondary electrons and scanning speed.

The specific operation principle of Wien filter lies in that, deflection directions of different charged particles are different from each other or one another, depending on different forces applied onto the charged particles by the magnetic field and electric field. Formula of the forces applied onto the charged particles lies in that:

$$F = q \cdot (E - v \times B) \quad (1)$$

From the above formula (1), it can be known that, if respective distributions of magnetic field and electric field can meet a certain relationship therebetween, then the force applied on the charged particles in one direction will be zero, while the force applied thereon in an opposite direction will not be zero. This is a condition which is often used by Wien filter, which is referred to as a Straight-Through condition, as follows:

$$v = E/B \quad (2)$$

For example, charged particles (such as secondary electrons and the like) which are incident onto and enter the Wien filter and in turn substantially/roughly satisfies the above formula (2) will be allowed to pass through the Wien filter and then be incident onto and entering a secondary electron detector.

In one aspect of embodiments of the present disclosure, according to a general inventive technical concept of the embodiments of the present disclosure, since the Wien filter is a composite deflector comprising electrostatic deflector(s) and magnetic deflector(s), the structural design of the Wien filter is improved, based on structural optimizations for the electrostatic deflector(s) and the magnetic deflector(s), respectively.

As illustrated in FIG. 5, for example, an exemplary Wien filter 3 comprises, for example, a Wien filter body, which comprises an electrostatic deflector 31 and a magnetic deflector 32, the number of electrodes in which respective two electrodes are arranged opposite to each other in each pair in the electrostatic deflector 31 and the number of magnetic poles in which respective two magnetic poles are arranged opposite to each other in each pair in the magnetic deflector 32 are selected to be the same, or alternatively different, provided that (i.e., as long as) a resultant electric field of the electrostatic deflector 31 is orthogonal to a resultant magnetic field of the magnetic deflector 32.

In a specific embodiment, for example, as illustrated in FIG. 5, the Wien filter 3 comprises, for example, an electrostatic deflector 31 and a magnetic deflector 32, the number of electrodes in which respective two electrodes are arranged opposite to each other in each pair in the electrostatic deflector 31 are the same as the number of magnetic poles in which respective two magnetic poles are arranged opposite to each other in each pair in the magnetic deflector 32, and a center of the resultant electric field of the electrodes in which respective two electrodes are arranged opposite to each other in each pair in the electrostatic deflector 31 are arranged to coincide with the a center of the resultant magnetic field of the magnetic poles in which respective two magnetic poles are arranged opposite to each other in each pair in the magnetic deflector 32, and the electrodes in which respective two electrodes are arranged opposite to each other in each pair in the electrostatic deflector 31 are arranged concentrically with the magnetic poles in which respective two magnetic poles are arranged opposite to each other in each pair in the magnetic deflector 32, and the respective two electrodes in each pair of electrodes in the electrostatic deflector 31 are diametrically opposite to each other, and the respective two magnetic poles in each pair of magnetic poles in each magnetic deflector 32 are diametrically opposite to each other, too. In FIG. 5, it merely schematically illustrates that, in the Wien filter 3, the electrostatic deflector 31 comprises only one pair of electrodes 301 and 303 opposite to each other, and the magnetic deflector 32 comprises only one pair of magnetic poles 302 and 304 opposite to each other. In an alternative embodiment, in the Wien filter, for example, the electrostatic deflector 31 comprises M pairs of electrodes in which respective two electrodes are arranged opposite to each other in each pair, and the magnetic deflector 32 comprises N pairs of magnetic poles in which respective two magnetic poles are arranged opposite to each other in each pair, and M and N are positive integers greater than or equal to 1. And M is for example selected to be different from N; or alternatively M is for example selected to be the same as N, but both M and N are greater than 1, provided that (i.e., as long as) the resultant electric field of the electrostatic deflector 31 is distributed orthogonal to the resultant magnetic field of the magnetic deflector 32, without being specifically defined here.

More specifically, for example, as illustrated, in the Wien filter 3, the electrostatic deflector 31 comprises: at least one pair of electrodes, respective two electrodes in each pair of which are opposite to each other, each electrode comprising an electrode body constructed in an arc-shaped form, and respective electrode bodies of respective two electrodes (e.g., as indicated by reference numerals 301, 303 as illustrated) in each pair of the at least one pair of electrodes being arranged concentrically with and opposite to each other in a diameter direction; and first protrusions, each of which extends radially inwards from a radial inner side of the respective electrode body. And in the Wien filter 3, the magnetic deflector 32 comprises: at least one pair of magnetic poles, respective two magnetic poles in each pair of which are opposite to each other, each magnetic pole comprising a magnetic pole body constructed in an arc-shaped form, and respective magnetic pole bodies of respective two magnetic poles (e.g., as indicated by reference numerals 302, 304 as illustrated) in each pair of the at least one pair of magnetic poles being arranged concentrically with and opposite to each other in the diameter direction, and the magnetic pole bodies of the at least one pair of magnetic poles in the magnetic deflector and the electrode bodies of the at least one pair of electrodes in the electrostatic deflector 31 being arranged concentrically and spaced apart from each other in a circumferential direction; and second protrusions, each of which extends radially inwards from a radial inner side of the respective magnetic pole body. Thereby, the electrodes of the electrostatic deflector 31 and the magnetic poles of the magnetic deflector 32 at least partially encompass and delimit a through-hole thereamong in the Wien filter, which through-hole opens axially and is configured to receive and to pass therethrough the charged particle beam which are to be screened by the Wien filter.

During the operation of the Wien filter, the at least one pair of electrodes of the electrostatic deflector are configured to generate respective electric fields by cooperation of the respective two electrodes in each pair of the at least one pair of electrodes, in the condition of respective bias voltages applied individually thereon; and the at least one pair of magnetic poles are configured to generate respective magnetic fields by cooperation of respective two magnetic poles in each pair of the at least one pair of magnetic poles; and the resultant electric field formed collectively by all of the respective electric fields is perpendicular to the resultant magnetic field formed collectively by all of the respective magnetic fields. The resultant magnetic field and the resultant electric field collectively cooperate to form a resultant deflection field of the Wien filter, which resultant deflection field is used to deflect the charged particles incident onto and entering the through-hole of the Wien filter for performing screening therein.

Based on the respective structures of aforementioned multi-electrode electrostatic deflector and the multi-magnetic pole magnetic deflector respectively where the electrodes and magnetic poles are optimally designed such that respective two electrodes in each pair are opposite to each other and respective two magnetic poles in each pair are opposite to each other and each of various electrodes or magnetic poles is provided with respective radial inwards protrusion so as to realize a minimal number of electrodes and a minimal number of magnetic poles and a decreased number of feed ports, then, in the embodiment of the present disclosure, the Wien filter is further improved, intending to improve the level of matching between respective distribution of the resultant electric field and the resultant magnetic field both of which are expected to be orthogonal to each other, so as to in turn ensure a minimal influence of the Wien filter on the primary charged particle beam and thus an effective screening of the secondary charged particle beam by deflection; as such, by way of example, the primary charged particle beam and the secondary charged particle beam are separated effectively to avoid mutual interference, thus further improving the image quality.

As far as the structure of the magnetic deflector 32 is concerned, in some embodiments of the present disclosure, for example, as illustrated in FIG. 5, the at least one pair of magnetic poles is formed by a magnetically permeable material and further comprise respective excitation coils which are coaxially provided (i.e., respective axes pass through the optical axis of the Wien filter) and has one and the same winding direction and are attached onto respective radial outer sides of the respective magnetic pole bodies of the at least one pair of magnetic poles, respectively, and are configured to generate respective magnetic fields by cooperation of respective two magnetic poles in each pair in case that an excitation current flows through the excitation coils, then, for example, the magnetic field may be adjusted by adjusting the excitation current. Or alternatively, in an alternative embodiment of the disclosure, by way of example, the at least one pair of magnetic poles is formed by a permanent magnetic material, and are configured to generate respective magnetic fields by cooperation of respective two magnetic poles in each pair, then the magnetic fields may not be adjustable.

In a further embodiment of the present disclosure, as an example, as illustrated in FIG. 5, the respective two electrode bodies of each pair of electrodes in the at least one pair of electrodes 301, 303 of the electrostatic deflector 31 extend across an equivalent radian and have a same shape as each other, respectively, in a circumferential direction of the respective two electrode bodies.

In a further embodiment of the present disclosure, as an example, as illustrated in FIG. 5, the respective two magnetic pole bodies of each pair of magnetic poles in the at least one pair of magnetic poles 302, 304 of the magnetic deflector 32 extend across an equivalent radian and have a same shape as each other, respectively, in a circumferential direction of the respective two magnetic pole bodies.

With such a setting, not only the shaping is facilitated, but also the respective secondary electric fields generated by electrodes in pairs respectively in the electrostatic deflector 31 of the Wien filter 3 have one and the same magnitude, and/or the respective secondary magnetic fields generated by magnetic poles in pairs respectively in the magnetic deflector 32 of the Wien filter 3 have one and the same magnitude, facilitating both calculation and control of the resultant deflection field.

In a further embodiment of the present disclosure, as an example, as illustrated in FIG. 5, the respective electrode bodies of the at least one pair of electrodes and the respective magnetic pole bodies of the at least one pair of magnetic poles extend across an equivalent radian and have a same shape, respectively, in a same circumference defined collectively by the respective electrode bodies and the respective magnetic pole bodies, and have a same inner radius at respective radial inner sides and a same outer radius at respective radial outer sides; and the respective electrode bodies of the at least one pair of electrodes and the respective magnetic pole bodies of the at least one pair of magnetic poles are spaced apart from one another angularly in the same circumference defined collectively by the respective electrode bodies and the respective magnetic pole bodies, and are arranged to be in rotational symmetry with reference to one another, and respective two electrodes in each pair of electrodes have central symmetry with reference to each other, and respective two magnetic poles in each pair of magnetic poles have central symmetry with reference to each other.

With such a setting, the electrodes of the electrostatic deflector 31 (especially the respective electrode bodies) and the magnetic poles of the magnetic deflector 32 (especially the respective magnetic pole bodies) in the Wien filter 3 are not only of the same shape as each other and in turn facilitate shaping thereof, but also are spaced apart from each other and one another at a same angle circumferentially, (that is to say, they are arranged in the way of dividing an overall circumference into several equal portions), such that the secondary deflection fields as generated (i.e., secondary electric fields and secondary magnetic fields) are respectively distributed throughout inside of the through-hole which is at least partially encompassed and delimited collectively by all the electrodes of the electrostatic deflector 31 and all the magnetic poles of the magnetic deflector 32 in the Wien filter 3, and are substantially/roughly evenly distributed in the through-hole (especially in the paraxial region next to the optical axis Z), so as to obtain a more uniform distribution and less local fluctuation of the resultant electric field and the resultant magnetic field, further facilitating the realization of a relatively high uniformity of the resultant deflection field. Such field distributions may facilitate decreasing an off-axis aberration caused by charged particles passing through the deflector, thus increasing the field of view of the image and improving the detection efficiency of the apparatus.

Moreover, in a further embodiment of the present disclosure, as an example, as illustrated in FIG. 5, the at least one pair of electrodes of the electrostatic deflector 31 is merely one pair of electrodes, and the at least one pair of magnetic poles of the magnetic deflector 32 is merely one pair of magnetic poles, and the pair of electrodes and the pair of magnetic poles are alternately spaced apart from one another at an angle of 90°. That is to say, the merely one pair of electrodes of electrostatic deflector 31 and the merely one pair of magnetic poles of magnetic deflector 32 are orthogonal to each other. Then, as illustrated, the electric field 308 generated by the electrostatic deflector 31 is the resultant electric field, and the magnetic field 307 generated by the magnetic deflector 32 is the resultant magnetic field.

With such a setting, not only the off-axis aberration caused by the charged particles passing through the through-hole of the Wien filter 3 is reduced, but also a simplified Wien filter is realized, by minimizing respective numbers of electrodes and magnetic poles as well as the required number of feed ports, thus simplifying the structural design and ensuring the simplicity of manufacturing and the accuracy of assembly. Moreover, it is convenient to simplify the structure in the manufacturing process to ensure that the resultant electric field and the resultant magnetic field are orthogonal to each other.

According to an embodiment of the present disclosure, for example, the first protrusions of the electrodes of the electrostatic deflector 31 and the second protrusions of the magnetic poles of the magnetic deflector 32 are shaped and dimensioned to minimize the off-axis aberration of a charged particle beam being incident on and entering the Wien filter and passing therethrough.

Specifically, by way of example, each of respective first protrusions of the at least one pair of electrodes extends circumferentially across an angle not exceeding a first angle range, and projects from respective radial inner side of respective electrode body at a distance not exceeding a first radial distance; and each of respective second protrusions of the at least one pair of magnetic poles extends circumferentially across an angle not exceeding a second angle range, and projects from respective radial inner side of respective magnetic pole body at a distance not exceeding a second radial distance.

Respective shapes and dimensions of the first protrusions and the second protrusions, especially respective radian angles that are spanned by the first protrusions and the second protrusions respectively in the circumferential direction (i.e., respective radian angles across which the first protrusions and the second protrusions extend in the circumferential direction respectively) are crucial to the uniformity of the resultant electric field, the uniformity of the resultant magnetic field and the uniformity of the entire resultant deflection field generated by the Wien filter, in the paraxial region.

Specifically, in case that not only radii of each electrode body and each magnetic pole body at their respective radial inner sides are given, but also a ratio of a maximum length of each first protrusion projecting from the radial inner side of the respective electrode body and in turn continuing extending radially inwards with reference to the inner radius of the respective electrode body at the radial inner side thereof is constant/fixed while a ratio of a maximum length of each second protrusion projecting from the radial inner side of the respective electrode body and in turn continuing extending radially inwards with reference to the inner radius of the respective magnetic pole body at the radial inner side thereof is also constant/fixed, then, the smaller the respective radian angles are, the smaller respective circumferential ranges of each electrode body and each magnetic pole body are, accordingly (i.e., the narrower the first protrusions and the second protrusions are in the circumferential direction), and then the larger respective degrees of approximation how the respective shapes and dimensions of the electrodes and the magnetic poles approximate to those of the electrodes and the magnetic poles without their respective first protrusions and second protrusions may be, as mentioned above, and the less obvious respective compensation effects of the first protrusions and the second protrusions on both change of the spacing between respective two electrodes in each pair of electrodes and change of the spacing between respective two magnetic poles in each pair of magnetic poles due to respective circumferential arrangements of the electrodes and the magnetic poles, accordingly. On the contrary, the bigger the respective radian angles are, the larger the respective circumferential ranges on each electrode body and each magnetic pole body which are occupied respectively by the respective first protrusion and the respective second protrusion are (i.e., the wider the first protrusions and the second protrusions are in the circumferential direction), and then the larger a degree of approximation how each pair of electrodes is approximately equivalent to a pair of plate-like electrodes parallel to each other and a degree of approximation how each pair of magnetic poles is approximately equivalent to a pair of plate-like magnetic poles parallel to each other may be, accordingly; as such, an effect of decreasing the influence of the distortion of the field lines of the respective secondary deflection fields of individual dual-pole deflectors (e.g., dual-electrode electrostatic deflector(s), and/or dual-magnetic pole magnetic deflector(s)) in the Wien filter at edges as compared with the field lines at center thereof, on the charged particle beam or secondary charged particle beam passing through the axial through-hole of the Wien filter, by the arrangement in which respective two electrode bodies in each pair of electrodes in the Wien filter are disposed opposite to each other and respective two magnetic pole bodies in each pair of magnetic poles in the Wien filter are disposed opposite to each other, in the circumferential direction, becomes less obvious.

In the Wien filter, it is usually focused on the distribution of the deflection field thereof in the paraxial region next to the optical axis. It is indicated by a numerical simulation that, for a given radius of each of the respective electrode bodies and another given radius of each of the respective magnetic pole bodies at respective radial inner side thereof, a resultant electric field distribution and a resultant magnetic field distribution each of which relatively approximates to a distribution of a dual-pole field may be obtained in a relatively larger range in the paraxial region correspondingly, by adopting a combinatorial optimization of both the maximum length of each of the first protrusions and the second protrusions projecting from the inner side of respective electrode body and respective magnetic pole body in turn continuing extending radially inwards, and the radian of each of the first protrusions and the second protrusions, facilitating providing the dual-electrode electric field and the dual-magnetic pole magnetic field which must be orthogonal to each other and obtaining the resultant deflection field similar to a dual-pole deflection field.

By way of example, the first angle range of the radian angle is 5° to 40° and the first radial distance is between 0.1 and 0.9 times of the respective inner radius at respective radial inner sides of the respective electrode bodies of each pair of electrodes; the second angle range of the radian angle is 5° to 40° and the second radial distance is between 0.1 and 0.9 times of the respective inner radius at respective radial inner sides of the respective magnetic bodies of each pair of magnetic poles. As such, in case of such a dimensional setting, it is possible to obtain a maximum distribution of the resultant deflection field equivalent to a distribution of a dual-pole field in the paraxial region next to the optical axis Z, throughout the inside of the through-hole of the Wien filter as illustrated in FIG. 5.

Further, for example, as illustrated in FIG. 5, each of the respective first protrusions of each pair of electrodes is shaped to be in the form of a boss which projects from the respective radial inner side of the respective electrode body of the respective electrode, and is provided with an arc-shaped concave top portion; and each of the respective second protrusions of each pair of magnetic poles is shaped to be in the form of a boss which projects from the respective radial inner side of the respective magnetic pole body of the respective magnetic pole, and is provided with an arc-shaped concave top portion. The maximum length of each of the first protrusions of each pair of electrodes projecting from the inner side of respective electrode body and in turn continuing extending radially inwards is a radius at the arc-shaped concave top portion of the boss thereof and the maximum length of each of the second protrusions of each pair of magnetic poles projecting from the inner side of respective magnetic pole body and in turn continuing extending radially inwards is a radius at the arc-shaped concave top portion of the boss thereof. Thus, for a given radius of each of the respective electrode bodies at respective radial inner side thereof, and for a given radius of each of the respective magnetic pole bodies at respective radial inner side thereof, an electrostatic field distribution and a magnetic field distribution each of which relatively approximates to a distribution of a dual-pole field may be obtained in a relatively larger range in the paraxial region correspondingly, by adopting a combinatorial optimization of both the radius at the arc-shaped concave top portion of the boss and the radian of each of the first protrusions and the second protrusions.

According to alternative embodiments of the present disclosure, for example, as illustrated in FIG. 4(*a*), FIG. 4(*b*) and FIG. 4(*c*), other alternative forms of the first projections and the second protrusions are shown. For example, FIG. 4(*a*) illustrates a schematic structural view of an alternative Wien filter for charged particles according to another embodiment of the present disclosure, schematically showing that each of the first protrusions in the respective schematic structures of various electrodes is specifically in the form of a multi-stage stepped boss which projects from the respective radial inner side of an electrode body of the respective electrode and is provided with a flat top portion, and each of the second protrusions in the respective schematic structures of various magnetic poles is specifically in the form of a multi-stage stepped boss which projects from the respective radial inner side of a magnetic pole body of the respective magnetic pole and is provided with a flat top portion; FIG. 4(*b*) illustrates a schematic structural view of an alternative Wien filter for charged particles according to another embodiment of the present disclosure, schematically showing that each of the first protrusions in the respective schematic structures of various electrodes is specifically in the form of a partial pyramid shape which projects from the respective radial inner side of an electrode body of the respective electrode and is provided with a convex and sharpened top portion, and each of the second protrusions in the respective schematic structures of various magnetic poles is specifically in the form of a partial pyramid shape which projects from the respective radial inner side of a magnetic pole body of the respective magnetic pole and is provided with a convex and sharpened top portion; and FIG. 4(*c*) illustrates a schematic structural view of an alternative Wien filter for charged particles according to another embodiment of the present disclosure, schematically showing that each of the first protrusions in the respective schematic structures of various electrodes is specifically in the form of a partial sphere shape which projects from the respective radial inner side of an electrode body of the respective electrode and is provided with a convex and domed top portion, and each of the second protrusions in the respective schematic structures of various magnetic poles is specifically in the form of a partial sphere shape which projects from the respective radial inner side of a magnetic pole body of the respective magnetic pole and is provided with a convex and domed top portion.

Specifically, for example, each of the respective first protrusions of each pair of electrodes and the respective second protrusions of each pair of magnetic poles is shaped to be in the form of one of a partial sphere, a partial cone and a partial pyramid projecting from the respective radial inner side of the respective electrode body of the respective electrode and the respective radial inner side of the respective magnetic pole body of the respective magnetic pole, and is provided with a convex top portion; or alternatively, each of the respective first protrusions of each pair of electrodes the respective second protrusions of each pair of magnetic poles is shaped to be in the form of one of a truncated frustum of a cone, a truncated spherical segment, a frustum, and a multi-stage stepped boss projecting from the respective radial inner side of the respective electrode body of the respective electrode and the respective radial inner side of the respective magnetic pole body of the respective magnetic pole, and is provided with a flat top portion.

Accordingly, the first angle range of the radian angle A', A" and A"" as illustrated in FIG. 4(a), FIG. 4(b) and FIG. 4(c) (as marked therein) for the respective first protrusions of each pair of electrodes and the second angle range of the radian angle A', A" and A''' as illustrated in FIG. 4(a), FIG. 4(b) and FIG. 4(c) (as marked therein) for the respective second protrusions of each pair of magnetic poles, are equal to a radian angle range occupied by each of first imaginary protrusions used instead of all the first protrusions of the at least one pair of electrodes, and a radian angle range occupied by each of second imaginary protrusions used instead of all the second protrusions of the at least one pair of magnetic poles, respectively, such that: electrodes alternatively having the first imaginary protrusions each of which is in the form of a boss projecting from respective radial inner side of the respective electrode body and is provided with an arch-shaped concave top portion, and magnetic poles alternatively having the second imaginary protrusions each of which is in the form of a boss projecting from respective radial inner side of the respective magnetic pole body and is provided with an arch-shaped concave top portion, cooperate with each other to generate an imaginary deflection field equivalent to the deflection field as generated by the Wien filter; that is to say, such radian angle ranges are essentially equivalent radian angles of equivalent arc-shaped bosses calculated depending on depending on respective secondary deflection fields.

As illustrated in FIG. 5, when a charged particle beam (e.g., an electron beam) passes through the Wien filter, theoretically, it is required for the Wien filter to ensure that its magnetic field 307 and electric field 308 are strictly perpendicular to each other, so as to ensure that the magnetic field force and the electric field force are opposite to each other in direction, and the electron beam passing therethrough may not be affected when the two forces are equal to each other. In principle, in order to meet such requirements, as far as a mechanical layout is concerned, a group of magnetic deflectors and a group of electrostatic deflectors should be in an orthogonal arrangement relative to each other. However, due to the limitation of the uniformity of the material for the magnetic poles, machining accuracy, assembly accuracy and the like, as well as design error, it is difficult to ensure that the magnetic field 307 and electric field 308 generated by the Wien filter are strictly perpendicular to each other along the optical axis. As such, it may not be ensured that the magnetic field force and electric field force are opposite to each other in direction, and the electron beam will deviate from its predetermined trajectory, or the degree of the electron beam passing through the optical axis plane (i.e., a plane in which the optical axis is located) may not be controlled. At this time, it is required that directions of both the electric field or magnetic field of the Wien filter are adjustable.

As an example, as illustrated in FIG. 5, the electric field 308 is formed by the electrodes 301 and 303 with respective bias voltage(s) being applied thereon respectively, and the magnetic field 307 is formed by the magnetic poles 302 and 304 with excitation current(s) being applied to the respective coils 306 on these magnetic poles, both the electric field and the magnetic field are not strictly vertical due to the above reasons. Thus, for example, by adjusting one of the resultant electric field and the resultant magnetic field, it can be ensured that the one of the resultant electric field and the resultant magnetic field is strictly orthogonal to the other of the resultant electric field and the resultant magnetic field.

In some embodiments of the present disclosure, for example, the at least one pair of magnetic poles of the magnetic deflector 32 is formed by an electrically conductive material into additional electrodes, and is configured to generate respective additional electric fields by cooperation of electric conduction of respective two magnetic poles in each pair in case that bias voltages are applied thereon respectively. Specifically, as illustrated, the electrodes 301 and 303 are applied with respective bias voltage(s) to form an electric field 308, and the coils 306 on the magnetic poles 302 and 304 are applied with an excitation current to form a magnetic field 307, and the electric field 308 and the magnetic field 307 are not strictly orthogonal to each other for example for various reasons mentioned above. At this time, in case that the magnetic deflector 32 is formed by a conductive material, for example, taking the magnetic field 307 as the reference, certain bias voltage(s) may be applied to the magnetic poles 302 and 304 (the polarities of the bias voltages applied respectively on the two magnetic poles are opposite to each other), such that the magnetic poles 302 and 304 also function as electrodes, and an additional electric field generated by them and the electric field 308 originally provided by the electrodes 301 and 303 both are considered as secondary deflection fields perpendicular to each other; and a resultant electric field which is possibly oriented in any direction may be obtained by combining the two electric fields. By adjusting the additional electric field generated by the magnetic poles being also used as additional electrodes, the resultant electric field formed by a combination of the additional electric field and the electric field originally formed without the additional electrodes can meet the requirement that the resultant electric field is strictly orthogonal to the magnetic field 307, such that the electromagnetic field condition of the Wien filter can be better satisfied, and the deviation in the trajectory of the charged particles can be controlled to be minimal. With a simulated analysis, it can be learns that, offset distances of the primary electron beam in two directions (such as the direction of the resultant magnetic field, and the direction of the resultant electric field orthogonal to the resultant magnetic field after the adjustment) may be greatly reduced after a correction of this implementation, such that the offset of the primary electron beam is minimized.

In other embodiments of the present disclosure, for example, the at least one pair of electrodes of the electrostatic deflector 31 is formed by a magnetically permeable material into additional magnetic poles and further comprises respective additional excitation coils which are attached onto respective radial outer sides of the respective electrode bodies of the at least one pair of electrodes, and is configured to generate respective additional magnetic fields by cooperation of respective two electrodes in each pair in case that an excitation current flows through the excitation coils. Specifically, as illustrated, the electrodes 301 and 303 are applied with respective bias voltage(s) to form an electric field 308, and the coils 306 on the magnetic poles 302 and 304 are applied with an excitation current to form a magnetic field 307, and the electric field 308 and the magnetic field 307 are not strictly orthogonal to each other for example for various reasons mentioned above. Alternatively or additionally, at this time, in case that the electrostatic deflector 31 is formed by a magnetically permeable material, for example, also taking the electric field 308 generated by the electrodes 301 and 303 as the reference, the magnetic field is adjusted to match with the electric field

308; that is to say, a magnetic field component perpendicular to the magnetic field 307 is added, such that the resultant magnetic field generated by both the magnetic field 307 and the magnetic field 307 which is originally generated merely with the magnetic poles 302 and 304, is perpendicular to the electric field 308. By way of example, an additional magnetic field is generated by using both electrodes 301 and 303 as magnetic poles and are wound with respective coils of the same winding direction thereon, with an excitation current being applied thereon. As such, the additional magnetic field is provided by the electrodes 301 and 303 functioning as the additional magnetic poles which are provided with respective coils of the same winding direction, with an excitation current being applied to the coils, and moreover, the additional magnetic field and the magnetic field 307 which is originally provided by the excitation coils of the magnetic poles 302 and 304, are both secondary deflection magnetic field perpendicular to each other, and a resultant electric field which is possibly oriented in any direction may be obtained by combining these two electric fields (i.e., the additional magnetic field and the magnetic field 307). By adjusting the additional magnetic field generated by the electrodes being also used as additional magnetic poles, the resultant magnetic field formed by a combination of the additional electric field and the electric field originally formed without the additional magnetic poles can meet the requirement that the resultant magnetic field is strictly orthogonal to the electric field 308, such that the electromagnetic field condition of the Wien filter can be better satisfied, and the deviation in the trajectory of the charged particles can be controlled to be minimal. With a simulated analysis, it can be learns that, offset distances of the primary electron beam in two directions (such as the direction of the resultant electric field, and the direction of the resultant magnetic field orthogonal to the resultant electric field after the adjustment) may be greatly reduced after a correction of this implementation, such that the offset of the primary electron beam is minimized.

Further, as an exemplary embodiment, on the basis of FIG. 5, all magnetic poles and all electrodes are functionally unified, by way of example; that is, as illustrated in FIG. 5, each pole serves as not only an electrode but also a magnetic pole. Specifically, the poles are formed by a material which is electrically conductive and magnetically permeable, and respective body of each pole is wound with respective coils of the same winding direction on the radial outer side thereof. As such, if merely voltage excitations which are opposite to each other are simultaneously applied to respective two poles in each pair of the two pairs of poles, respectively, then, the deflector as illustrated essentially functions as a quadruple-electrode electrostatic deflector. If current excitation is applied to the respective excitation coil of each pole simultaneously, then the deflector as illustrated functions as a quadruple-pole magnetic deflector. If not only voltage excitations which are opposite to each other are simultaneously applied to respective two poles in each pair of the two pairs of poles, but also current excitation is applied to the respective excitation coil of each pole simultaneously, then, the deflector as illustrated essentially functions as a quadruple-electrode electromagnetic composite deflector; and further if the excitation of the electromagnetic field satisfies or approximately satisfies condition of the Wien filter, that is, the resultant electric field and the resultant magnetic field generated thereby are orthogonal to each other. Then the deflector as illustrated essentially functions as a Wien filter.

Figure 7A:
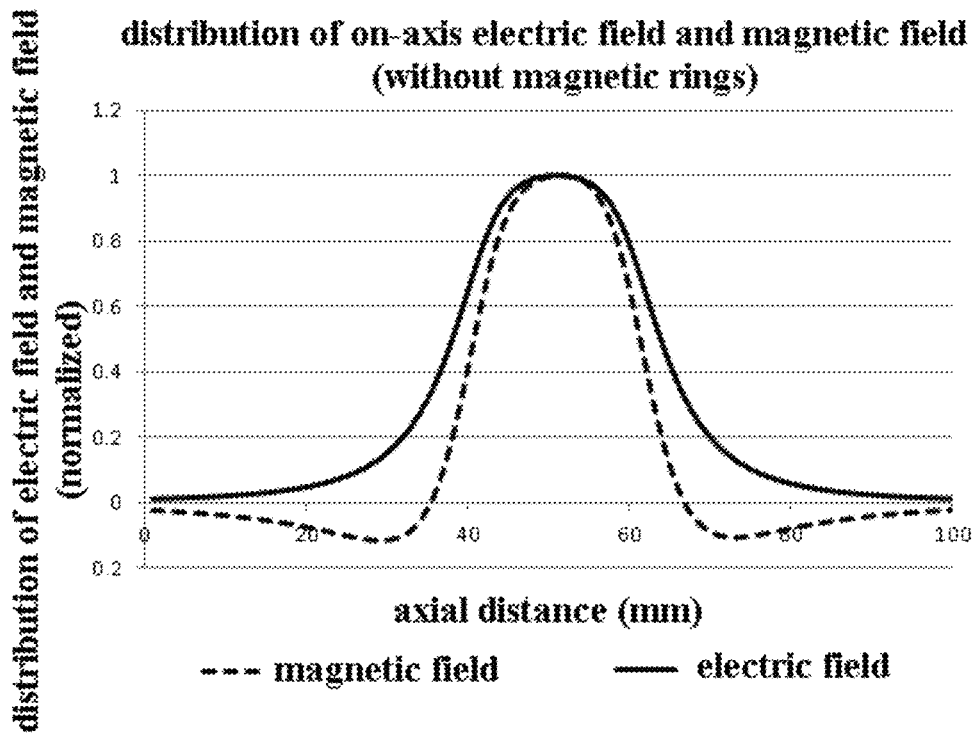
FIG. 7(a) illustrates exemplary distribution curves of on-axis electric and magnetic fields, without adding magnetic rings, which function as the regulator, on both sides of the Wien filter body.
Figure 7B:
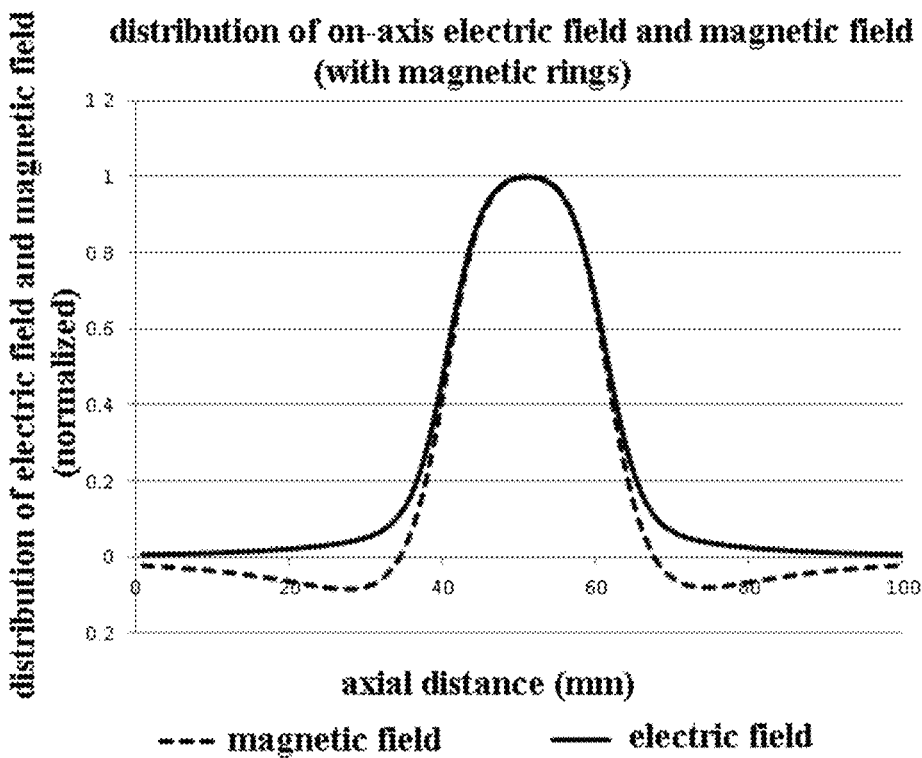
FIG. 7(b) illustrates exemplary distribution curves of on-axis electric and magnetic fields, with magnetic rings, which function as the regulator, being added on both sides of the Wien filter body.

When a charged particle beam passes through the Wien filter, feed-through conditions for the Wien filter need to be satisfied throughout/across all points on the optical axis extending through the Wien filter, which requires that there should be a relatively high matching degree between the respective distributions of the magnetic field 307 and the electric field 308 in FIG. 5 along the optical axis (that is, the respective distributions of the resultant magnetic field and the resultant electric field (e.g., the respective central points thereof in respective cross sections) along the optical axis should be substantively the same, i.e., the respective distribution curves along the optical axis should be substantively the same), so as to simplify the excitation control on both bias voltage(s) and exciting current. In the application example of the present disclosure, for example, in case that the magnetic poles and the electrodes are functionally unified (i.e., each type of the electrodes and the magnetic poles is formed by a material which is electrically conductive and magnetically permeable, and respective body of each one of the electrodes and the magnetic poles is wound with respective coils of the same winding direction on the radial outer side thereof, such that each electrode also operates as an additional magnetic pole while each magnetic pole also operates as an additional electrode) in the above exemplary embodiments, although the respective axial distributions of the electric field and magnetic field are relatively similar, it cannot be ensured that the respective axial distributions of the electric field and magnetic field are completely matched with each other. As illustrated in FIG. 7(*a*), the distribution curves of the respective distributions of the electric field and magnetic field along the optical axis of the Wien filter are illustrated, and as illustrated in these curves, it can be found that the distribution curves of the electric field and magnetic field along the optical axis of the Wien filter have relatively large deviations therebetween approaching both ends thereof (i.e. where the resultant electric field and the resultant magnetic field tend to be close to zero) along respective extending directions on both sides, horizontal coordinates of which both ends tend to be far away from the origin of the optical axis (i.e. the origin is approximately located at the center of the through hole of the Wien filter, where the axial distance/length is deemed to be zero, i.e., at the position where the resultant electric field and the resultant magnetic field both are approximate to zero), which leads to the decrease of the accuracy of the Wien filter. This is because the electric field lines are not in the form of close-loop, while the magnetic field lines are in the form of close-loop, and in the process of forming a closed loop of the magnetic field lines, the direction of magnetic field will be subject to an abrupt change near the ends at both sides thereof that tend to be far away from the origin of the optical axis, as illustrated in the schematic distribution of magnetic field lines in FIG. 8(*a*). In order to achieve a higher degree of matching between the resultant electric field and the resultant magnetic field at the respective edges thereof, for example, an additional regulator is introduced.

Figure 6:
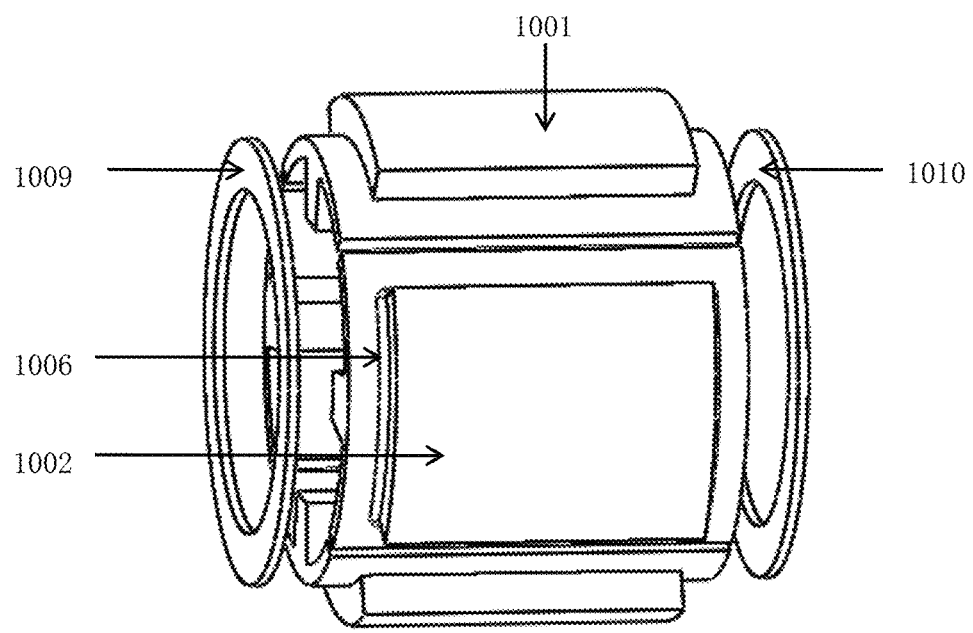
FIG. 6 illustrates a three-dimensional structural view of a Wien filter according to another embodiment of the present disclosure, which illustrates that the Wien filter has additional regulator being schematically in the form of annular shape.

FIG. 6 illustrates a three-dimensional structural view of a Wien filter according to another embodiment of the present disclosure, which illustrates that the Wien filter has additional regulator being schematically in the form of annular shape.

Figure 8A:
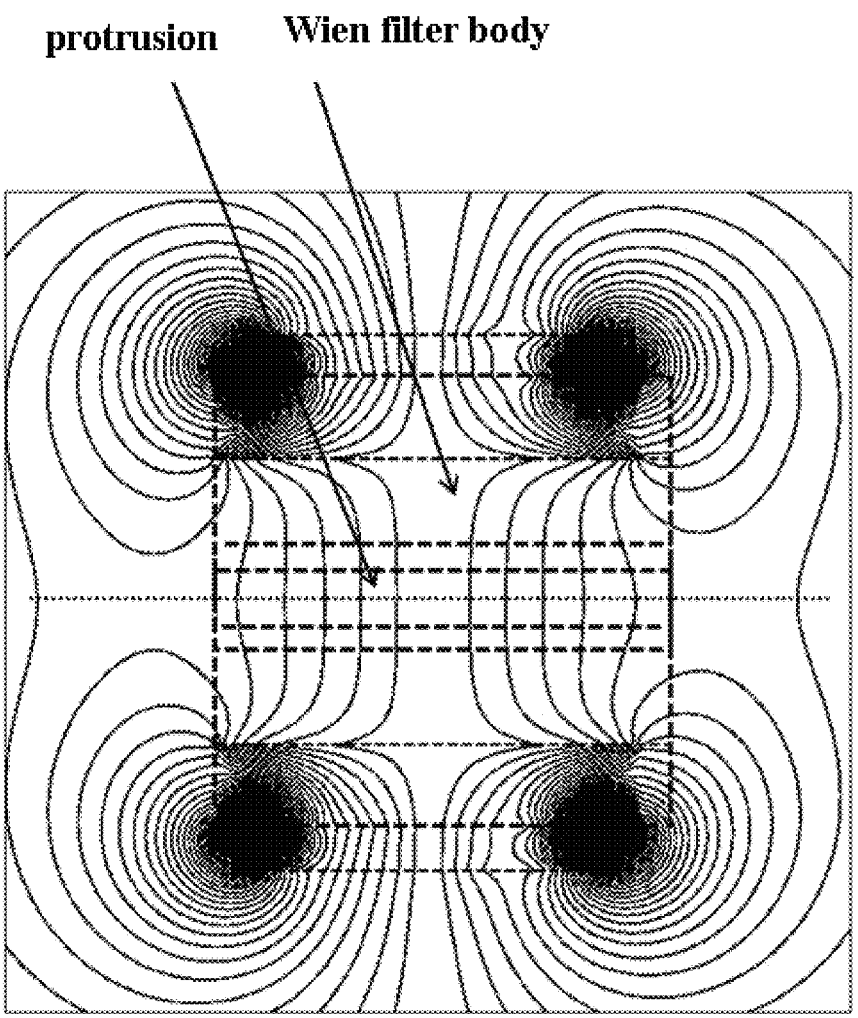
FIG. 8(a) illustrates exemplary distribution curves of magnetic field lines, without adding magnetic rings, which function as the regulator, on both sides of the Wien filter body.
Figure 8B:
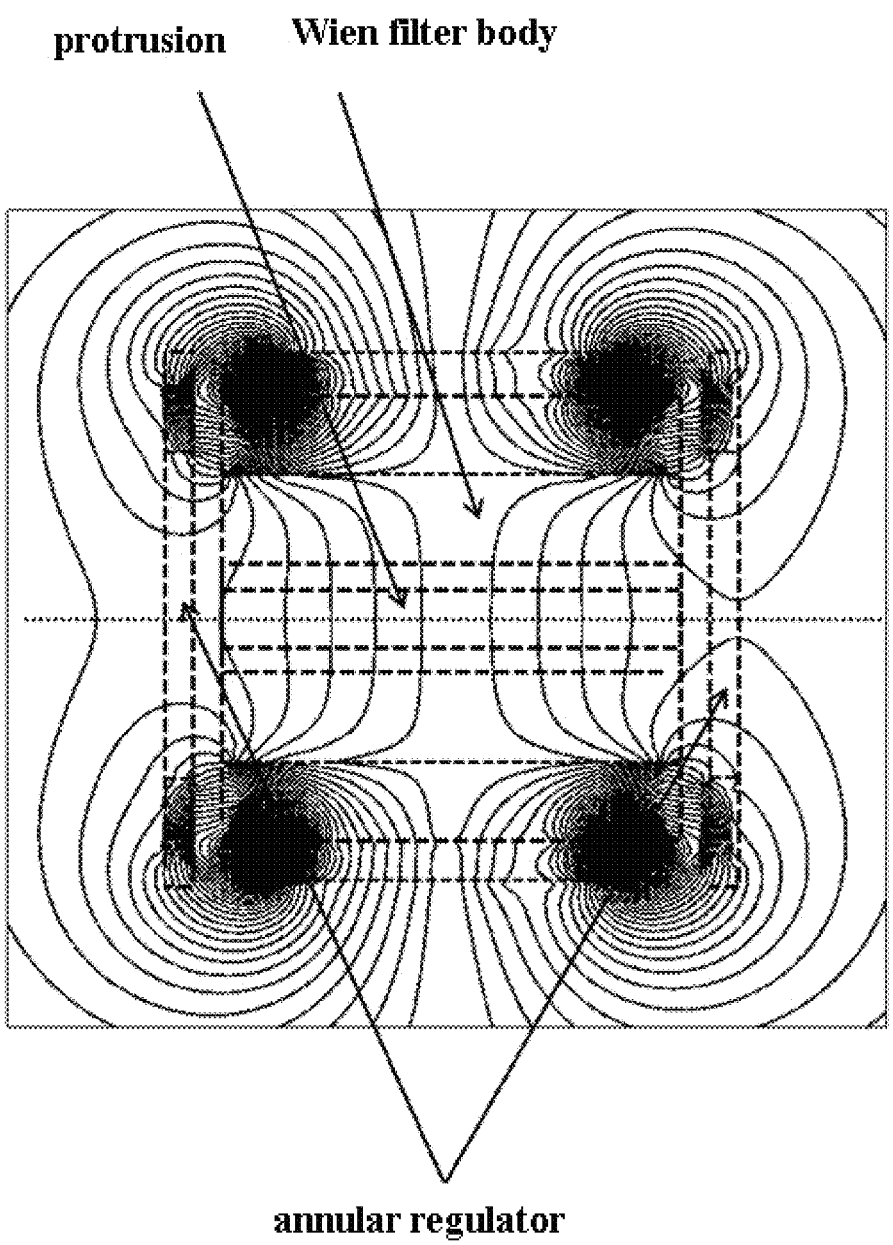
FIG. 8(b) illustrates an exemplary distribution of magnetic field lines, with magnetic rings, which function as the regulator, being added on both sides of the Wien filter body.
Figure 9A:
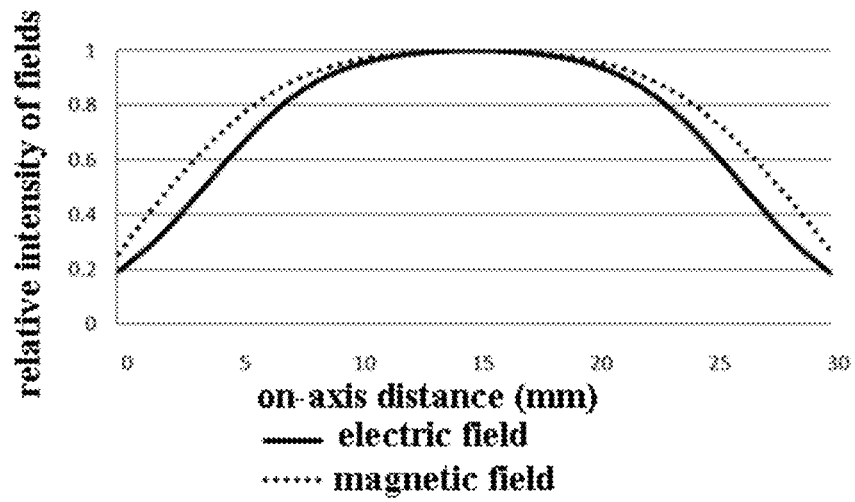
FIG. 9(a), FIG. 9(b) and FIG. 9(c) illustrate respective influence of magnetic rings which are added on both sides of the Wien filter body to function as the regulator, on specific distribution of the on-axis field, respectively.
Figure 9B:
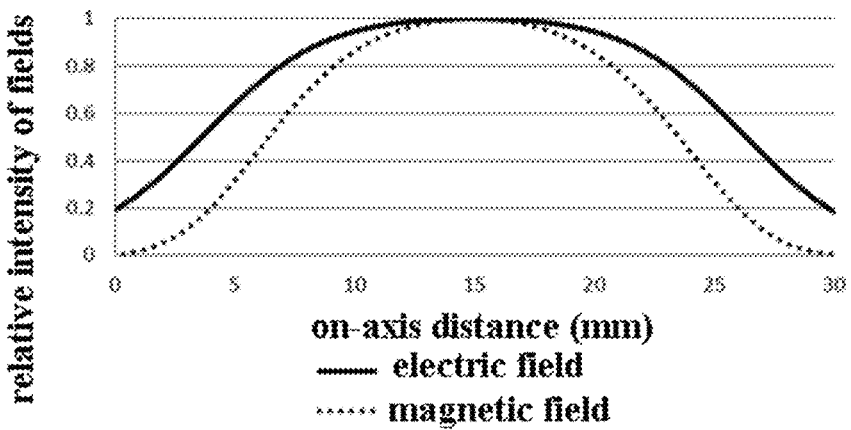
Figure 9C:
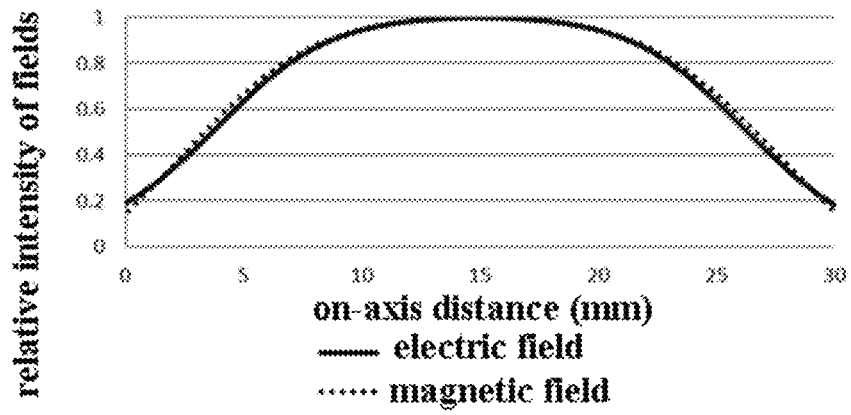

In some embodiments of the present disclosure, as illustrated in FIG. 6, as an example, a regulator is introduced, comprising a pair of regulator bodies which are annular and are arranged coaxially on both sides of the Wien filter body of the Wien filter. For example, in response to the case that the at least one pair of electrodes is formed by a magnetically permeable material into additional magnetic poles and further comprises respective additional excitation coils which are attached onto respective radial outer sides of the respective electrode bodies of the at least one pair of electrodes, the pair of regulator bodies are two magnetic rings 1009 and 1010 arranged coaxially on both sides of the Wien filter body and spaced apart from the Wien filter body respectively. By adjusting the respective positions and shapes of the magnetic rings, the marginal distribution of the magnetic field (also referred to as distribution of the magnetic field on edges thereof) on both sides of the Wien filter body is corrected. The magnetic rings are located and dimensioned to converge magnetic field lines at an edge of the resultant magnetic field which distributes substantially along the optical axis and would have been originally generated by the Wien filter without the regulator, so as to match the resultant electric field, along the optical axis. In the embodiment of the present disclosure, magnetic rings of appropriate size are added on both sides of the Wien filter body, for example at edges of the magnetic field which are far away from the origin of the optical axis, facilitating that the magnetic field lines substantially along the optical axis and passing through the edges of the resultant magnetic field can be converged there, so as to reduce or shrink the distribution range of the on-axis magnetic field, and in turn to reduce the distribution deviation between the magnetic field and the electric field, and thus to obtain a better degree of matching at the edges on both sides, as illustrated in FIG. 8(*b*). By adding magnetic rings 1009 and 1010, the magnetic field distribution at the edge of the original resultant magnetic field substantially along the optical axis of the Wien filter is weakened, and the magnetic field lines are converged by the magnetic rings, such that the magnetic field lines converge inwards due to the influence of the magnetic force applied by the magnetic rings there, and then a phenomenon of the abrupt change of the direction of magnetic field (i.e., the direction of the magnetic field lines) at the edges of the resultant magnetic field is alleviated, i.e., a magnitude of the abrupt change of the direction is alleviated in the region where the magnetic field distribution substantially long the optical axis is subject to abrupt change of the direction of the magnetic field, such that the magnetic field lines passing through the edges of the Wien filter or the optical axis nearby are converged, and in turn the degree of matching between the distribution of the magnetic field and the distribution of the electric field is decreased; in other words, a better degree of matching between the distribution of the magnetic field and the distribution of the electric field can be obtained at respective edges thereof, on both sides of the Wien filter, by using the magnetic rings 1009 and 1010 which are arranged coaxially on both sides of the Wien filter body. As illustrated in FIG. 9(*b*), as an example, provided that the outer radius of the boss of each magnetic pole is R2, the inner radius of the magnetic rings ranges between 0.1*R2 and 1.5*R2, and the spacing between the magnetic rings and the deflectors is between 0.1*R2 and 3*R2. A modification of the design of the distribution of magnetic field lines at the edges of the original resultant magnetic field substantially along the optical axis in the Wien filter by setting the positions and dimensions of the magnetic rings, essentially falls within the scope of protection of the disclosure.

In some alternative embodiments of the present disclosure, as illustrated in FIG. 6, as an example, a regulator is introduced, comprising a pair of regulator bodies which are annular and are arranged coaxially on both sides of the Wien filter body of the Wien filter as designed above. For example, in response to the case that the at least one pair of magnetic poles is formed by an electrically conductive material into additional electrodes, the pair of regulator bodies are two electrode rings 1009 and 1010 arranged coaxially on both sides of the Wien filter body and spaced apart from the Wien filter body respectively. The electrode rings 1009 and 1010 are not only grounded, but also are applied with bias voltages respectively, for example, so as to generate an additional electric field for adjusting and modifying the electric field distribution at the edges (where the electric field intensity is close to zero) of the original resultant electric field substantially along the optical axis in the Wien filter. As an example, provided that the outer radius of the boss of each electrode is R2, the inner radius of the electrode rings ranges between 0.1*R2 and 1.5*R2, and the spacing between the electrode rings and the deflectors is between 0.1*R2 and 3*R2. A modification of the design of the electric field at the edges of the original resultant electric field substantially along the optical axis in the Wien filter by setting the positions and dimensions of the electrode rings, essentially falls within the scope of protection of the disclosure.

Figure 10A:
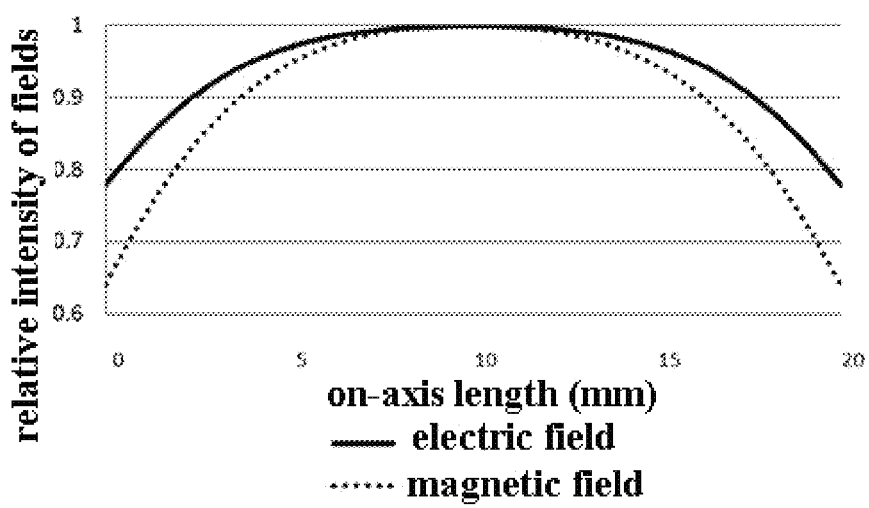
FIG. 10(a), FIG. 10(b) and FIG. 10(c) illustrate respective influence of electrode rings which are added on both sides of the Wien filter body to function as the regulator, on specific distribution of the on-axis field, respectively.
Figure 10B:
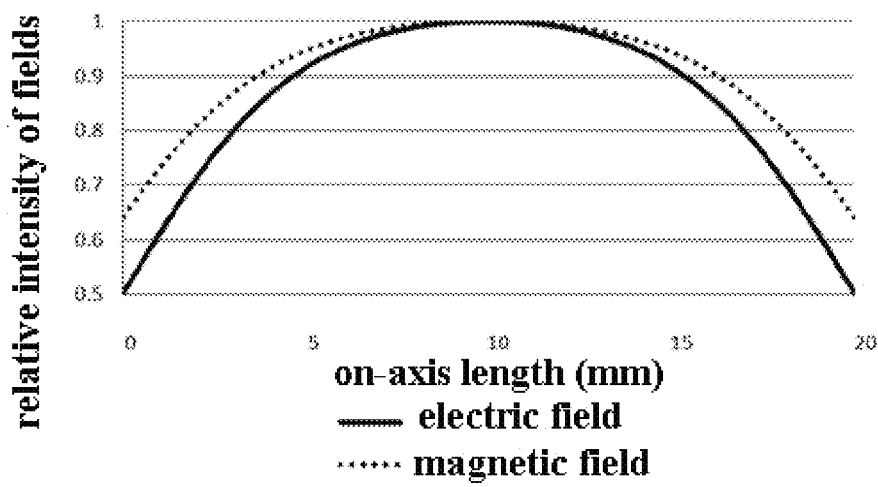
Figure 10C:
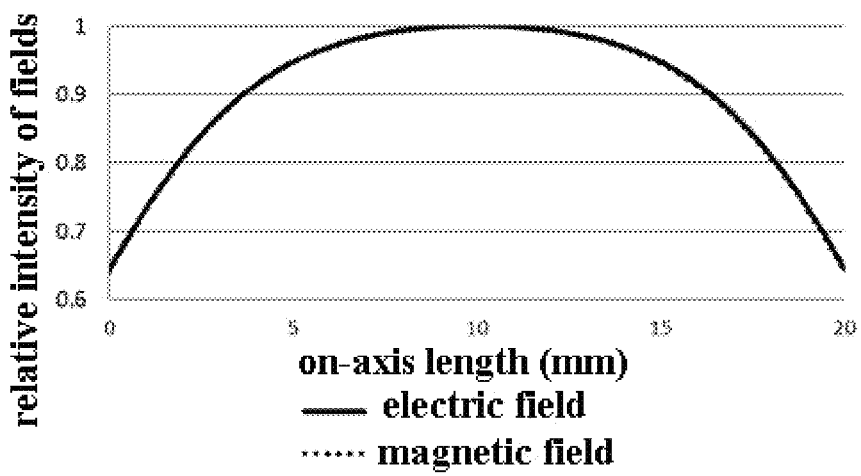

FIG. 9(*a*), FIG. 9(*b*) and FIG. 9(*c*) illustrate respective influence of magnetic rings which are added on both sides of the Wien filter body to function as the regulator, on specific distribution of the on-axis field, respectively; and FIG. 10(*a*), FIG. 10(*b*) and FIG. 10(*c*) illustrate respective influence of electrode rings which are added on both sides of the Wien filter body to function as the regulator, on specific distribution of the on-axis field, respectively.

According to the embodiment of the present disclosure, as illustrated in FIG. 9(*a*), FIG. 9(*b*) and FIG. 9(*c*), and FIG. 10(*a*), FIG. 10(*b*) and FIG. 10(*c*), a relatively high degree of matching between the distribution of the electric field and the distribution of the magnetic field may be obtained along the axis, by selection of appropriate parameters (positions, sizes, excitations, and the like) of the magnetic rings and the electrode rings.

For example, FIG. 9(*a*), FIG. 9(*b*) and FIG. 9(*c*) illustrate the respective distributions of the on-axis deflection field (comprising both the resultant electric field and the resultant magnetic field) in case that each magnetic ring is at a distance of 1.5 mm away from the Wien filter and has the thickness thereof being 0.5 mm, 1 mm and 1.5 mm respectively. As illustrated, as far as the degree of matching between the resultant magnetic field and the resultant electric field is concerned, the matching effect is the best in case that the thickness of the magnetic ring is 1 mm. At that time, the operation conditions of Wien filter are satisfied advantageously.

And, for example, FIG. 10(*a*), FIG. 10(*b*) and FIG. 10(*c*) respectively illustrate the respective distributions of the on-axis deflection field (comprising both resultant electric field and resultant magnetic field) in case that each electrode ring has the thickness of 1 mm and is at a distance of 0.5 mm, 1.5 mm, 1 mm away from the Wien filter respectively. as far as the degree of matching between the resultant magnetic field and the resultant electric field is concerned, the matching effect is the best in case that the distance between the electrode rings and the Wien filter is 1 mm. At that time, the operation conditions of Wien filter are satisfied advantageously.

In conclusion, designs in which the magnetic rings or the electrode rings have a thickness of 0.1 mm to 5 mm and a spacing of 0.1 mm to 10 mm, all fall within the scope of protection of the disclosure.

By setting the magnetic rings or electrode rings as the regulator bodies, and by adjusting their respective positions and sizes, it is convenient to realize a modification of the designs of the magnetic field and the electric field at the edges of the original resultant magnetic field or the original electric field which is originally generated without the additional regulator, along the optical axis of the Wien filter, facilitating achieving a relatively higher degree of matching between the resultant electric field and the resultant magnetic field, so as to meet the operation conditions of the Wien filter more strictly.

Figure 11:
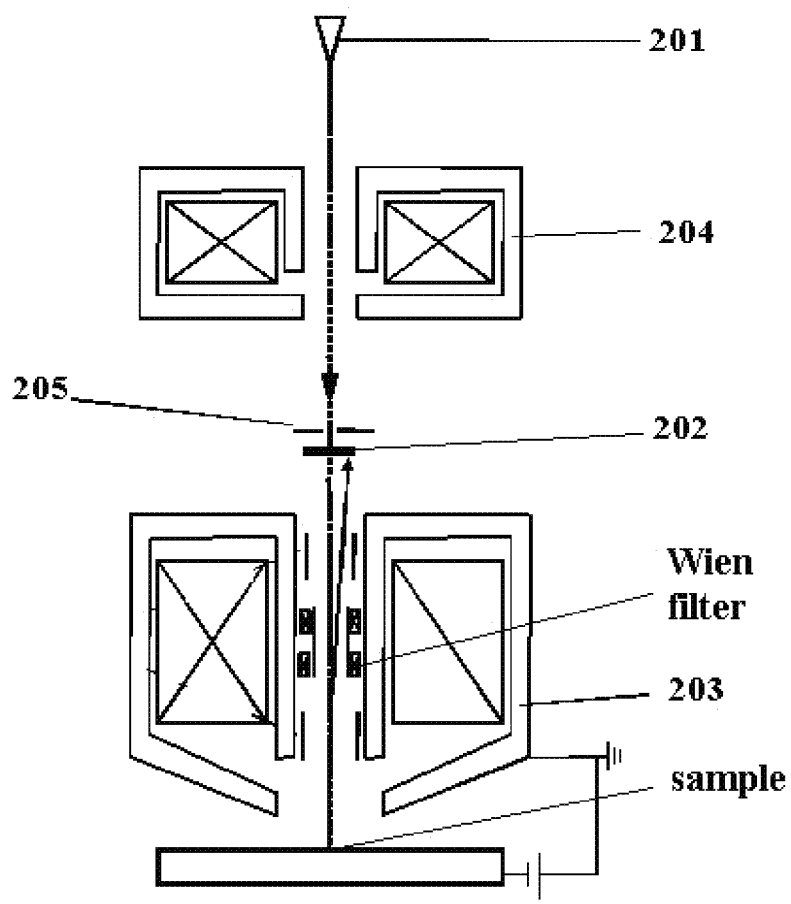
FIG. 11 illustrates a schematic structural view of a charged particle beam imaging apparatus according to embodiments of the present disclosure, in which the Wien filter for secondary charged particles described above is used.

FIG. 11 illustrates a schematic structural view of a charged particle beam imaging apparatus according to embodiments of the present disclosure, in which the Wien filter described above is used.

In another aspect of the embodiments of the present disclosure, as illustrated in FIG. 11, a charged particle beam imaging apparatus 2 is provided, which is constructed as an electronic optical apparatus which is configured to project a charged particle beam to a surface of a sample to be tested and in turn to image the charged particle beam, the charged particle beam imaging apparatus further comprising:

a charged particle source 201 configured to emit the charged particle beam;

at least one pair of deflectors 1, which are symmetrically arranged with respect to an optical axis of the charged particle beam, and are configured to deflect and project the charged particle beam to the surface of the sample to be tested in response to a scanning signal applied thereon;

the Wien filter as described above; and a secondary charged particle detector 202, which is located along the optical axis Z but offset from the optical axis and between the charged particle source 201 and the sample to be tested, and is configured to collect and image the secondary charged particles generated by the charged particle beam projected to the sample to be tested.

The at least one pair of deflectors 1 are symmetrically arranged with respect to the optical axis Z of the charged particle beam and are configured to deflect and project the charged particle beam to the surface of the sample to be tested (e.g., a semiconductor device) in response to a scanning signal (e.g., a grating scanning signal) applied thereon.

Moreover, the Wien filter is configured to deflect secondary charged particles (e.g., secondary electrons), and to project them to the secondary charged particle detector 202 for imaging. Since the Wien filter described above is contained in the charged particle beam imaging apparatus 2, the specific structural features of the Wien filter will not be described repeatedly here; moreover, the charged particle beam imaging apparatus 2 also has the technical effect of the aforementioned Wien filter, and will not be repeated here.

In a further embodiment, for example, the charged particle beam imaging apparatus 2 further comprises an objective lens 203, which is arranged coaxially with the optical axis Z and downstream the at least one pair of deflectors 1, and is configured to converge and finally project the charged particle beam deflected by the deflector onto the surface of the sample to be tested.

Moreover, in a further embodiment, for example, the Wien filter is located in the objective lens 203 and between the sample and the secondary charged particle detector 202, and is configured to receive the secondary charged particles emitted from the sample and deflect the secondary charged particles toward the secondary charged particle detector 202.

In a further embodiment, for example, the charged particle beam imaging apparatus 2 further comprises:

at least one focusing lens 204, which is arranged coaxially with the optical axis Z and between the charged particle source 201 and the at least one pair of the deflectors 1, and is configured to pre-focus and collimate the charged particle beam which is about to be incident to the multi-pole deflector; and a restricting stop 205, which is disposed between the at least one focusing lens 204 and the at least one pair of the deflectors 1, and is configured to adjust at least one of shape and size of the charged particle beam In a further embodiment, for example, the charged particle beam imaging apparatus 2 further comprises an aberration correction device, which is arranged coaxially with the optical axis and between the at least one pair of deflectors and the objective lens, and is configured to perform dynamic correction on a beam spot of the charged particle beam passing therethrough.

In a further embodiment, for example, as illustrated in FIG. 11, the charged particle beam imaging apparatus 22 further comprises the Wien deflector which is located in the objective lens 203 and is operable to deflect the secondary charged particles passing therethrough to a side of the optical axis Z such that the secondary charged particles are incident towards the secondary charged particle detector 202 for detection and imaging of the secondary charged particles.

Figure 12A:
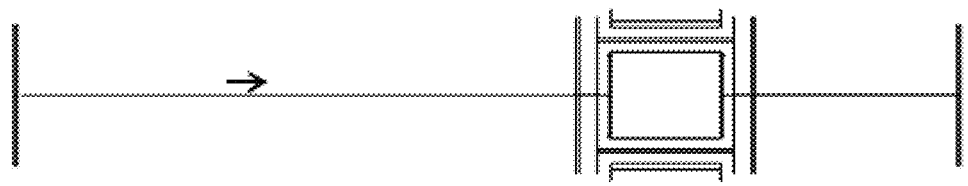
FIG. 12(a) illustrates a state in which a primary electron beam acting as an incident charged particle beam passes through the Wien filter.
Figure 12B:
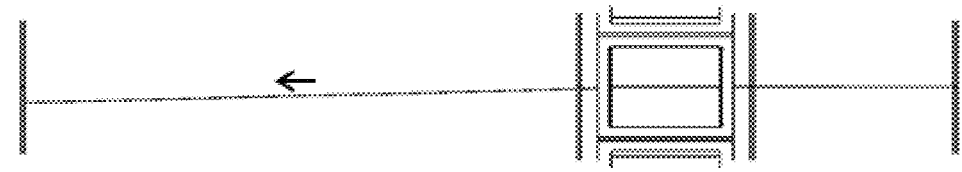
FIG. 12(b) illustrates a state in which a secondary charged particle beam passes through the Wien filter in a reverse direction.

FIG. 12(a) illustrates a state in which a primary electron beam acting as an incident charged particle beam passes through the Wien filter; and FIG. 12(b) illustrates a state in which a secondary charged particle beam passes through the Wien filter in a reverse direction.

As an example, FIG. 12(a) and FIG. 12(b) illustrate the trajectories of the primary electron beams and secondary electron beams both passing through the inventively designed Wien filter structure, respectively. The primary electron beams pass through the Wien filter and hit (i.e., impinge on) the surface of the sample. An on-axis offset distance of the electron beams is very small, such that the primary electron beam is substantially not affected. The secondary electrons which are ejected therefrom pass through the Wien filter in an opposite/reverse direction and strike on the secondary electron detector, with a relatively large on-axis offset distance of the secondary electrons, such that most of the secondary electrons returned therefrom can be received by the detector, which reduces the influence of the central through-hole of the detector, improves the detection efficiency of the secondary electrons, and improves the image quality.

The embodiments of the present disclosure are described in a progressive manner. Each embodiment focuses on the differences thereof as compared with other embodiments, and the same or similar parts of various embodiments can be referred to each other. In addition, according to the aforementioned embodiments of the present disclosure, it can be understood that any technical solution constructed through a combination of any two or more solutions may also fall within the scope of protection of the present disclosure.

The above are merely preferred embodiments of the invention and are not intended to limit the disclosure. Any modification, equivalent replacement, improvement, and the like made within the spirit and principles of the invention shall be contained in the protection scope of disclosure.

What is claimed is:

1. A Wien filter, comprising a Wien filter body which comprises:

an electrostatic deflector, comprising at least one pair of electrodes, respective two electrodes in each pair of which are opposite to each other, each electrode comprising an electrode body constructed in an arc-shaped form, and respective electrode bodies of respective two electrodes in each pair of the at least one pair of electrodes being arranged concentrically with and opposite to each other in a diameter direction, and the at least one pair of electrodes being configured to generate respective electric fields by cooperation of the respective two electrodes in each pair of the at least one pair of electrodes, in the condition of respective bias voltages applied individually thereon; and a magnetic deflector, comprising at least one pair of magnetic poles, respective two magnetic poles in each pair of which are opposite to each other, each magnetic pole comprising a magnetic pole body constructed in an arc-shaped form, and respective magnetic pole bodies of respective two magnetic poles in each pair of the at least one pair of magnetic poles being arranged concentrically with and opposite to each other in the diameter direction, and the magnetic pole bodies of the at least one pair of magnetic poles in the magnetic deflector and the electrode bodies of the at least one pair of electrodes in the electrostatic deflector being arranged concentrically and spaced apart from each other in a circumferential direction, and the at least one pair of magnetic poles being configured to generate respective magnetic fields by cooperation of respective two magnetic poles in each pair of the at least one pair of magnetic poles, wherein a resultant electric field formed collectively by all of the respective electric fields is perpendicular to a resultant magnetic field formed collectively by all of the respective magnetic fields; and wherein each electrode is also provided with a respective first protrusion extending radially inwards from a radial inner side of the respective electrode body thereof, and each magnetic pole is also provided with a second protrusion extending radially inwards from a radial inner side of the respective magnetic pole body thereof, wherein the electrostatic deflector comprises the at least one pair of electrodes which are formed by a conductive material and are not multiplexed as magnetic poles, and are configured to generate the respective electric fields cooperatively when bias voltages are applied thereon respectively, and the respective electric fields are synthesized by combination of vectors into the resultant electric field of the electrostatic deflector, without generating magnetic field;

wherein the magnetic deflector comprises the at least one pair of magnetic poles which are not multiplexed as electrodes, and are configured to generate the respective magnetic fields cooperatively, and the respective magnetic fields are synthesized by combination of vectors into the resultant magnetic field of the magnetic deflector, without generating electric field;

wherein the Wien filter further comprises a regulator, the regulator comprising a pair of regulator bodies which are annular and are arranged coaxially on both sides of the Wien filter body, wherein the pair of regulator bodies are two magnetic rings arranged coaxially on both sides of the Wien filter body and spaced apart from the Wien filter body respectively, and the magnetic rings are located and dimensioned to converge magnetic field lines at an edge of the resultant magnetic field which distributes substantially along the optical axis and would have been originally generated by the Wien filter without the regulator, so as to match the resultant electric field, along the optical axis; or wherein the pair of regulator bodies are two electrode rings arranged coaxially on both sides of the Wien filter body and spaced apart from the Wien filter body respectively, and the electrode rings are located and dimensioned to correct a distribution of the electric field which distributes substantially along the optical axis and would have been originally generated by the Wien filter without the regulator, at an edge of the electric field where an electric field intensity has its value being close to 0, so as to match the resultant magnetic field, along the optical axis.

2. The Wien filter according to claim 1,
wherein the at least one pair of magnetic poles is formed by a magnetically permeable material and further comprise respective excitation coils which are attached onto respective radial outer sides of the respective magnetic pole bodies of the at least one pair of magnetic poles, respectively, and are configured to generate respective magnetic fields by cooperation of respective two magnetic poles in each pair in case that an excitation current flows through the excitation coils; or wherein the at least one pair of magnetic poles is formed by a permanent magnetic material, and are configured to generate respective magnetic fields by cooperation of respective two magnetic poles in each pair.

3. The Wien filter according to claim 1,
wherein the respective electrode bodies of respective two electrodes in each pair of the at least one pair of electrodes extend across an equivalent radian and have a same shape as each other, respectively, in a circumferential direction of the respective two electrode bodies; and/or wherein the respective magnetic pole bodies of respective two magnetic poles in each pair of the at least one pair of magnetic poles extend across an equivalent radian and have a same shape as each other, respectively, in a circumferential direction of the respective two magnetic pole bodies.

4. The Wien filter according to claim 1,
wherein the respective electrode bodies of the at least one pair of electrodes and the respective magnetic pole bodies of the at least one pair of magnetic poles extend across an equivalent radian and have a same shape, respectively, in a same circumference defined collectively by the respective electrode bodies and the respective magnetic pole bodies, and have a same inner radius at respective radial inner sides and a same outer radius at respective radial outer sides; and wherein the respective electrode bodies of the at least one pair of electrodes and the respective magnetic pole bodies of the at least one pair of magnetic poles are spaced apart from one another angularly in the same circumference defined collectively by the respective electrode bodies and the respective magnetic pole bodies, and are arranged to be in rotational symmetry with reference to one another, and respective two electrodes in each pair of electrodes have central symmetry with reference to each other, and respective two magnetic poles in each pair of magnetic poles have central symmetry with reference to each other.

5. The Wien filter according to claim 4, wherein, the at least one pair of electrodes and the at least one pair of magnetic poles are arranged to space apart from one another at a same angle circumferentially.

6. The Wien filter according to claim 5, wherein the at least one pair of electrodes is merely one pair of electrodes, and the at least one pair of magnetic poles is merely one pair of magnetic poles, and the pair of electrodes and the pair of magnetic poles are alternately spaced apart from one another at an angle of 90°.

7. The Wien filter according to claim 1, wherein the first protrusions and the second protrusions are shaped and dimensioned to minimize an off-axis aberration of a charged particle beam being incident on and entering the Wien filter and passing therethrough.

8. The Wien filter according to claim 7, wherein, each of respective first protrusions of the at least one pair of electrodes extends circumferentially across an angle not exceeding a first angle range, and projects from respective radial inner side of respective electrode body at a distance not exceeding a first radial distance; and each of respective second protrusions of the at least one pair of magnetic poles extends circumferentially across an angle not exceeding a second angle range, and projects from respective radial inner side of respective magnetic pole body at a distance not exceeding a second radial distance.

9. The Wien filter according to claim 8,
wherein the first angle range is from 5° to 40° and the first radial distance is between 0.1 and 0.9 times of the respective inner radius at respective radial inner side of the respective electrode body of each electrode; and
wherein the second angle range is from 5° to 40° and the second radial distance is between 0.1 and 0.9 times of the respective inner radius at respective radial inner side of the respective magnetic body of each magnetic pole.

10. The Wien filter according to claim 8,
wherein each of respective first protrusions of the at least one pair of electrodes is shaped to be in the form of a boss, which projects from the respective radial inner side of the respective electrode body of the respective electrode and is provided with an arch-shaped concave top portion; and/or
wherein each of respective second protrusions of the at least one pair of magnetic poles is shaped to be in the form of a boss, which projects from the respective radial inner side of the respective magnetic pole body of the respective magnetic pole and is provided with an arch-shaped concave top portion.

11. The Wien filter according to claim 8,
wherein each of respective first protrusions of the at least one pair of electrodes is shaped to be in the form of one of a partial sphere, a partial cone and a partial pyramid projecting from the respective radial inner side of the respective electrode body of the respective electrode and is provided with a convex top portion; and/or
wherein each of respective second protrusions of the at least one pair of magnetic poles is shaped to be in the form of one of a partial sphere, a partial cone and a partial pyramid projecting from the respective radial inner side of the respective magnetic pole body of the respective magnetic pole and is provided with a convex top portion.

12. The Wien filter according to claim 8,
wherein each of respective first protrusions of the at least one pair of electrodes is shaped to be in the form of one of a truncated frustum of a cone, a truncated spherical segment, a frustum, and a multi-stage stepped boss projecting from the respective radial inner side of the respective electrode body of the respective electrode and is provided with a flat top portion; and/or
wherein each of respective second protrusions of the at least one pair of magnetic poles is shaped to be in the form of one of a truncated frustum of a cone, a truncated spherical segment, a frustum, and a multi-stage stepped boss projecting from the respective radial inner side of the respective magnetic pole body of the respective magnetic pole and is provided with a flat top portion.

13. The Wien filter according to claim 8, wherein the first protrusions and the second protrusions are both constructed in one and the same shape.

14. The Wien filter according to claim 8, wherein the first angle range and the second angle range are respectively equal to respective radian angle ranges occupied by each of first imaginary protrusions used instead of all the first protrusions of the at least one pair of electrodes and each of second imaginary protrusions used instead of all the second protrusions of the at least one pair of magnetic poles, respectively such that: electrodes alternatively having the first imaginary protrusions each of which is in the form of a boss projecting from respective radial inner side of the respective electrode body and is provided with an arch-shaped concave top portion, and magnetic poles alternatively having the second imaginary protrusions each of which is in the form of a boss projecting from respective radial inner side of the respective magnetic pole body and is provided with an arch-shaped concave top portion, cooperate with each other to generate an imaginary deflection field equivalent to the deflection field as generated by the Wien filter.

15. The Wien filter according to claim 1, wherein an outer radius of the boss of the each magnetic pole is R2, and an inner radius of each magnetic ring ranges between 01*R2 and 1.5*R2, with a spacing of the magnetic rings from the Wien filter body being between 0.1*R2 and 3*R2.

16. The Wien filter according to claim 1, wherein an outer radius of the boss of the each electrode ring is R2, and an inner radius of each electrode ring ranges between 01*R2 and 1.5*R2, with a spacing of the electrode rings from the Wien filter body being between 0.1*R2 and 3*R2.

17. The Wien filter according to claim 1,
wherein the electrostatic deflector comprises merely one pair of electrodes, respective two electrodes of which are opposite to each other; and
wherein the magnetic deflector comprises only one pair of magnetic poles, respective two magnetic poles of which are opposite to each other.

18. A charged particle beam imaging apparatus, which is configured to project a charged particle beam to a surface of a sample to be tested and in turn to image the charged particle beam, the charged particle beam imaging apparatus further comprising:
a charged particle source configured to emit the charged particle beam; at least one pair of deflectors, which are symmetrically arranged with respect to an optical axis of the charged particle beam, and are configured to deflect and project the charged particle beam to the surface of the sample to be tested in response to a scanning signal applied thereon;
an objective lens, which is arranged coaxially with the optical axis and downstream the at least one pair of deflectors, and is configured to converge and finally project the charged particle beam onto the surface of the sample to be tested;
a secondary charged particle detector, which is located along the optical axis but offset from the optical axis and between the charged particle source and the sample to be tested, and is configured to collect and image the secondary charged particles generated by the charged particle beam projected to the sample to be tested; and the Wien filter according to claim 1, which is located in the objective lens and between the sample and the secondary charged particle detector, and is configured to receive the secondary charged particles emitted from the sample and deflect the secondary charged particles toward the secondary charged particle detector.

* * * * *